US010672784B2

(12) United States Patent
Kasashima

(10) Patent No.: US 10,672,784 B2
(45) Date of Patent: Jun. 2, 2020

(54) SEMICONDUCTOR MEMORY DEVICE

(71) Applicant: TOSHIBA MEMORY CORPORATION, Minato-ku (JP)

(72) Inventor: Shunsuke Kasashima, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/293,809

(22) Filed: Mar. 6, 2019

(65) Prior Publication Data

US 2020/0075607 A1 Mar. 5, 2020

(30) Foreign Application Priority Data

Aug. 30, 2018 (JP) ................................. 2018-162051

(51) Int. Cl.
| | | |
|---|---|---|
| *H01L 23/52* | (2006.01) | |
| *H01L 21/44* | (2006.01) | |
| *H01L 27/1157* | (2017.01) | |
| *H01L 27/11582* | (2017.01) | |
| *H01L 27/11573* | (2017.01) | |

(52) U.S. Cl.
CPC .... *H01L 27/1157* (2013.01); *H01L 27/11573* (2013.01); *H01L 27/11582* (2013.01)

(58) Field of Classification Search
CPC ................................................. H01L 27/11582
USPC .................. 438/584–598; 257/385, 756, 758
See application file for complete search history.

(56) References Cited

U.S. PATENT DOCUMENTS

| | | | | |
|---|---|---|---|---|
| 9,520,407 B2 * | 12/2016 | Fukuzumi | ........... | H01L 29/7926 |
| 9,806,091 B2 | 10/2017 | Miyagawa et al. | | |
| 10,026,749 B2 * | 7/2018 | Park | .................. | H01L 21/76879 |
| 10,192,929 B2 * | 1/2019 | Mori | ..................... | H01L 27/249 |
| 2019/0296038 A1 * | 9/2019 | Noda | ................ | H01L 27/11573 |

FOREIGN PATENT DOCUMENTS

JP 2017-174866 9/2017

* cited by examiner

*Primary Examiner* — Calvin Lee
(74) *Attorney, Agent, or Firm* — Oblon, McClelland, Maier & Neustadt, L.L.P.

(57) ABSTRACT

A semiconductor memory device according to an embodiment includes: a substrate; a plurality of first gate electrodes; a first semiconductor film facing the plurality of first gate electrodes; a first gate insulating film provided between the plurality of first gate electrodes and the first semiconductor film; a plurality of second gate electrodes that are further from the substrate than the plurality of first gate electrodes; a second semiconductor film facing the plurality of second gate electrodes; a second gate insulating film provided between the plurality of second gate electrodes and the second semiconductor film; a third gate electrode provided between the plurality of first gate electrodes and the plurality of second gate electrodes; a third semiconductor film facing the third gate electrode; and a third gate insulating film provided between the third gate electrode and the third semiconductor film, a width in a second direction of the third semiconductor film being larger than that of a one end of the second semiconductor film, and smaller than that of the other end of the first semiconductor film.

8 Claims, 22 Drawing Sheets

SEMICONDUCTOR MEMORY DEVICE

CROSS-REFERENCE TO RELATED APPLICATIONS

This application is based upon and claims the benefit of Japanese Patent Application No. 2018-162051, filed on Aug. 30, 2018, the entire contents of which are incorporated herein by reference.

BACKGROUND

Field

Embodiments described below relate to a semiconductor memory device.

Description of the Related Art

There is known a semiconductor memory device that includes: a substrate; a plurality of gate electrodes arranged in a first direction intersecting a surface of the substrate; a semiconductor film extending in the first direction to face these plurality of gate electrodes; and a gate insulating film provided between the plurality of gate electrodes and the semiconductor film.

DETAILED DESCRIPTION

Figure 1:
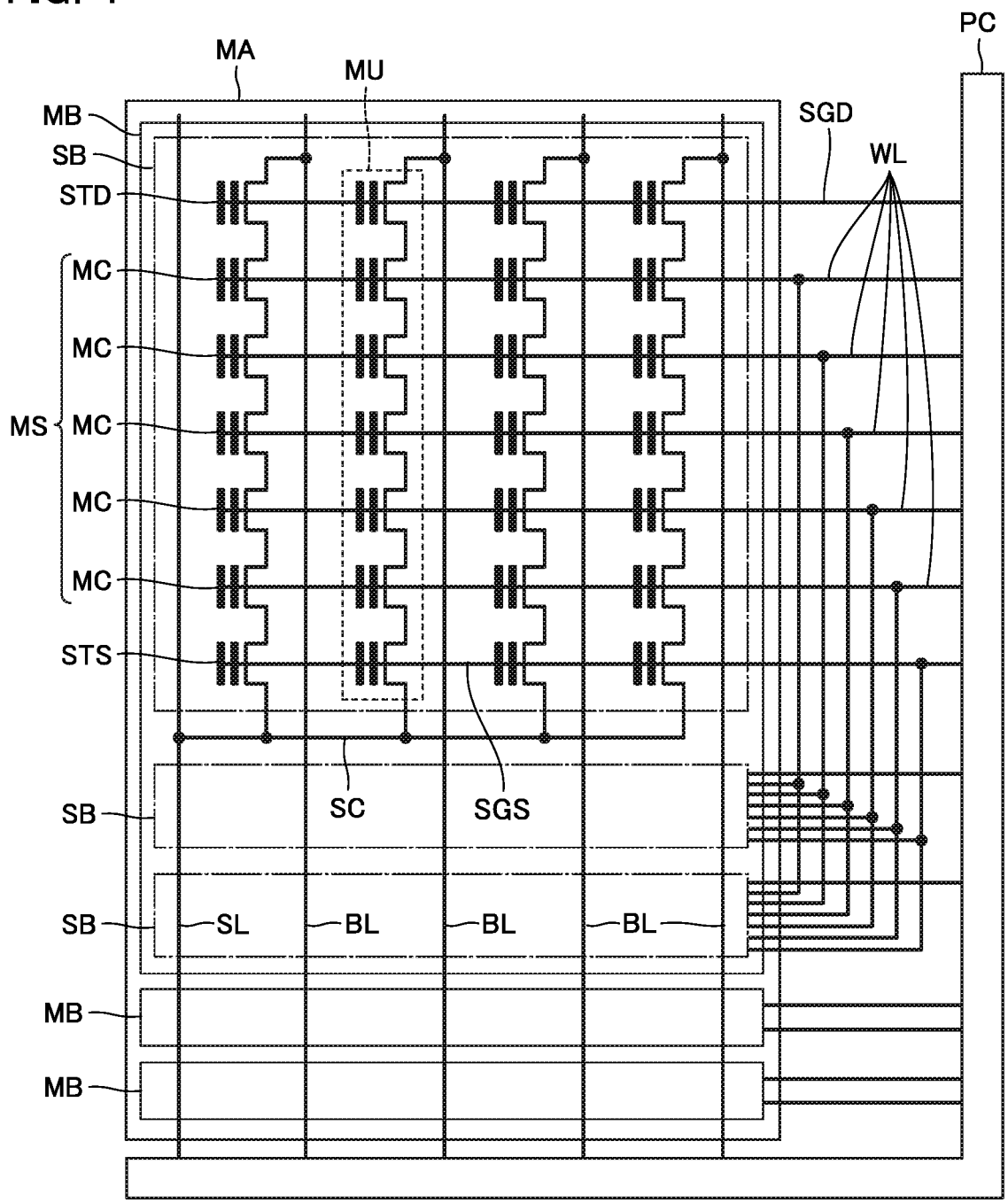
FIG. 1 is a schematic equivalent circuit diagram of a semiconductor memory device according to a first embodiment.

A semiconductor memory device according to an embodiment includes: a substrate; a plurality of first gate electrodes that are arranged in a first direction intersecting a surface of the substrate and extend in a second direction intersecting the first direction; a first semiconductor film that extends in the first direction and faces the plurality of first gate electrodes, a width in the second direction of a one end on a substrate side of the first semiconductor film being smaller than a width in the second direction of the other end of the first semiconductor film; and a first gate insulating film that is provided between the plurality of first gate electrodes and the first semiconductor film. Moreover, this semiconductor memory device includes: a plurality of second gate electrodes that are arranged in the first direction, extend in the second direction, and are further from the substrate than the plurality of first gate electrodes; a second semiconductor film that extends in the first direction and faces the plurality of second gate electrodes, a width in the second direction of a one end on a substrate side of the second semiconductor film being smaller than a width in the second direction of the other end of the second semiconductor film; and a second gate insulating film that is provided between the plurality of second gate electrodes and the second semiconductor film. Moreover, this semiconductor memory device includes: a third gate electrode that is provided between the plurality of first gate electrodes and the plurality of second gate electrodes, and extends in the second direction; a third semiconductor film that is connected to the other end of the first semiconductor film and the one end of the second semiconductor film, a width in the first direction of the third semiconductor film being smaller than those of the first semiconductor film and the second semiconductor film, and a width in the second direction of the third semiconductor film being smaller than the width in the second direction of the other end of the first semiconductor film, and larger than the width in the second direction of the one end of the second semiconductor film; and a third gate insulating film that is provided between the third gate electrode and the third semiconductor film.

Next, embodiments of a semiconductor memory device will be described in detail with reference to the drawings. Note that these embodiments are merely examples, and are not shown with the intention of limiting the present invention.

Moreover, in the present specification, a direction intersecting a surface of a substrate will be called a first direction, a direction intersecting the first direction will be called a second direction, and a direction intersecting the first direction and the second direction will be called a third direction. Moreover, a certain direction parallel to the surface of the substrate will be called an X direction, a direction parallel to the surface of the substrate and perpendicular to the X direction will be called a Y direction, and a direction perpendicular to the surface of the substrate will be called a Z direction. The X direction, the Y direction, and the Z direction may or may not each respectively correspond to any one of the first through third directions.

Moreover, in the present specification, expressions such as "up" or "down" will be defined with reference to the substrate. For example, an orientation of moving away from the substrate along the above-described first direction will be called up, and an orientation of coming closer to the substrate along the first direction will be called down. Moreover, when a lower surface or a lower end is referred to for a certain configuration, this will be assumed to mean a surface or end section on a substrate side of the configuration, and when an upper surface or an upper end is referred to for a certain configuration, this will be assumed to mean a surface or end section on an opposite side to the substrate of the configuration. Moreover, a surface intersecting the second direction or the third direction will be called a side surface, and so on.

Moreover, in the present specification, when a "radial direction" is referred to for the likes of a cylinder-shaped or ring-shaped member or a through-hole, this will be assumed to mean a direction of coming closer to a central axis of the cylinder or ring or a direction of moving away from the central axis of the cylinder or ring, in a plane perpendicular to this central axis. Moreover, when a "thickness in the radial direction", and so on, is referred to, this will be assumed to mean a difference between a distance from the central axis to an inner circumferential surface and a distance from the central axis to an outer circumferential surface, in such a plane.

Moreover, in the present specification, when a "width" or "thickness" in a certain direction is referred to for a configuration, a member, and so on, this will sometimes mean a width or thickness in a cross section observed by the likes of SEM (Scanning Electron Microscopy) or TEM (Transmission Electron Microscopy), and so on.

First Embodiment

[Configuration]

FIG. 1 is a schematic equivalent circuit diagram of a semiconductor memory device according to a first embodiment. For convenience of description, part of a configuration is omitted in FIG. 1.

The semiconductor memory device according to the present embodiment includes: a memory cell array MA; and a peripheral circuit PC that controls the memory cell array MA.

The memory cell array MA includes a plurality of memory blocks MB. These plurality of memory blocks MB each include a plurality of sub-blocks SB. These plurality of sub-blocks SB each include a plurality of memory units MU. One ends of these plurality of memory units MU are respectively connected to the peripheral circuit PC via bit lines BL. Moreover, the other ends of these plurality of memory units MU are each connected to the peripheral circuit PC via a common lower wiring SC and common source line SL.

The memory unit MU includes a drain select transistor STD, a memory string MS, and a source select transistor STS that are connected in series between the bit line BL and the lower wiring SC. Hereafter, the drain select transistor STD and the source select transistor STS will sometimes simply be called select transistors (STD, STS).

The memory string MS includes a plurality of memory cells MC connected in series. The memory cell MC is a field effect transistor that includes a semiconductor film, a gate insulating film, and a gate electrode. The semiconductor film functions as a channel region. The gate insulating film includes a memory section capable of storing data. This memory section is a charge accumulating film such as a silicon nitride film (SiN) or a floating gate, for example. In this case, a threshold voltage of the memory cell MC changes according to an amount of charge in the charge accumulating film. The gate electrode is connected to a word line WL. The word lines WL are provided corresponding to the plurality of memory cells MC belonging to one memory string MS, and are commonly connected to all of the memory strings MS in one memory block MB.

The select transistor (STD, STS) is a field effect transistor that includes a semiconductor film, a gate insulating film, and a gate electrode. The semiconductor film functions as a channel region. The gate electrode of the drain select transistor STD is connected to a drain select line SGD. The drain select line SGD is provided corresponding to the sub-block SB and is commonly connected to all of the drain select transistors STD in one sub-block SB. The gate electrode of the source select transistor STS is connected to a source select line SGS. The source select line SGS is commonly connected to all of the source select transistors STS in one memory block MB.

The peripheral circuit PC generates a voltage required for a read operation, a write operation, and an erase operation, and applies the voltage to the bit line BL, the source line SL, the word line WL, and the select gate line (SGD, SGS), for example. The peripheral circuit PC includes a plurality of transistors and wirings provided on the same chip as the memory cell array MA, for example.

Figure 2:
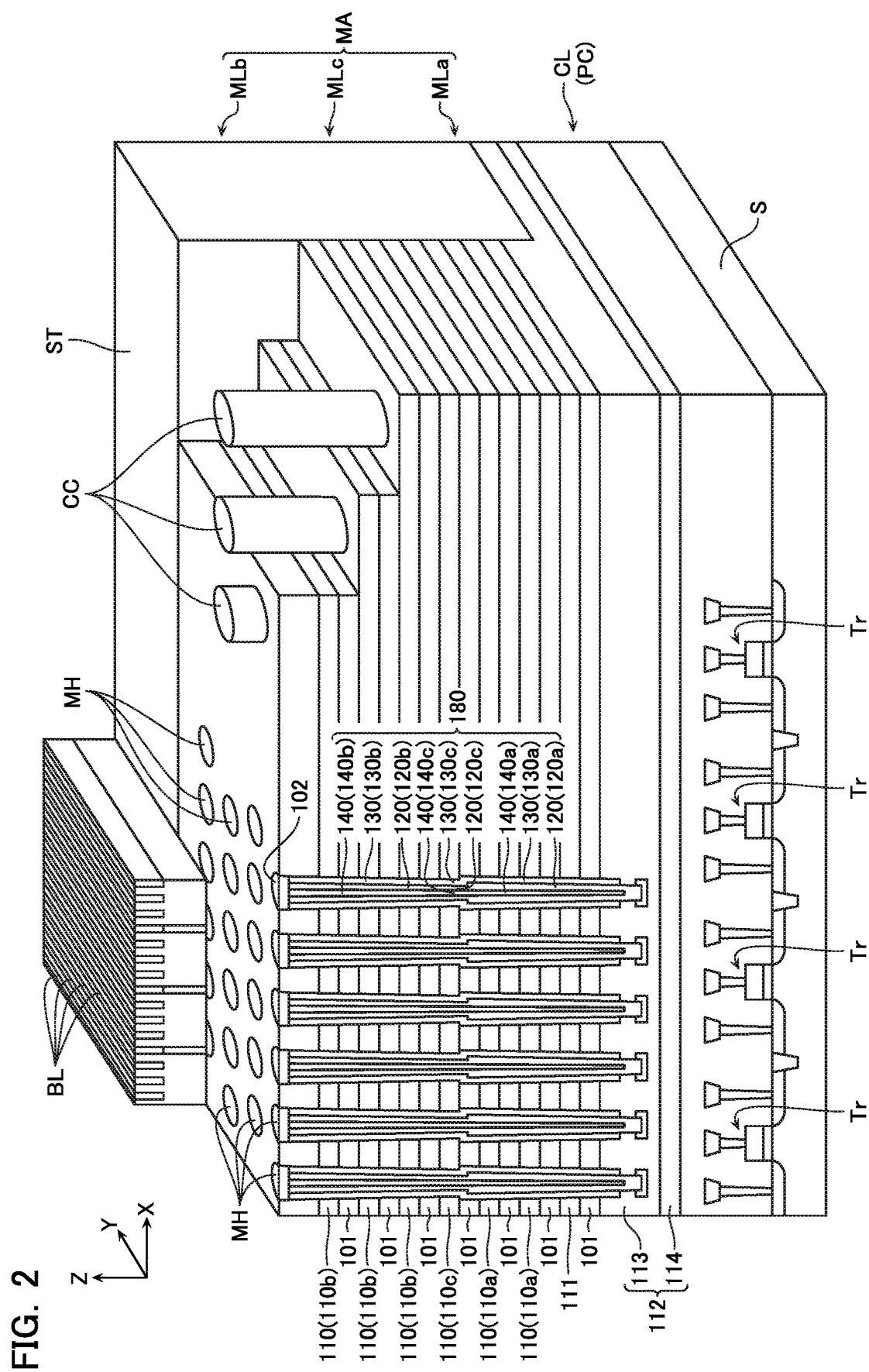
FIG. 2 is a schematic perspective view showing a configuration of part of same semiconductor memory device.

FIG. 2 is a schematic perspective view of the semiconductor memory device according to the present embodiment. For convenience of description, part of a configuration is omitted in FIG. 2.

As shown in FIG. 2, the semiconductor memory device according to the present embodiment includes: a substrate S; a circuit layer CL provided above the substrate S; and the memory cell array MA provided above the circuit layer CL. Moreover, the memory cell array MA includes: a memory layer MLa; a memory layer MLb provided above the memory layer MLa; and a memory layer MLc provided between the memory layers MLa, MLb.

The substrate S is a semiconductor substrate configured from the likes of single crystal silicon (Si), for example. The substrate S has a double well structure in which, for example, an n type impurity layer is included in a surface of the semiconductor substrate, and a p type impurity layer is further included in this n type impurity layer.

The circuit layer CL includes: a plurality of transistors Tr; and a plurality of wirings and contacts connected to these plurality of transistors Tr, that, together with the plurality of transistors Tr, configure the peripheral circuit PC (FIG. 1). The transistor Tr is a field effect transistor that utilizes as a channel region the surface of the substrate S, for example.

The memory cell array MA includes: a plurality of conductive films 110 arranged in the Z direction; a plurality of semiconductor films 120 extending in the Z direction to face the plurality of conductive films 110; and a gate insulating film 130 provided between these conductive films 110 and semiconductor films 120.

The conductive film 110 is a conductive film such as tungsten (W), for example, and functions as the word line WL (FIG. 1) and the gate electrodes of the plurality of memory cells MC connected to this word line WL, or as the drain select line SGD (FIG. 1) and the gate electrodes of the plurality of drain select transistors STD (FIG. 1) connected to this drain select line SGD. Moreover, a conductive film 111 and a conductive film 112 are provided below the plurality of conductive films 110. The conductive film 111 is a conductive film such as polycrystalline silicon (Si) implanted with an n type impurity such as phosphorus (P), for example, and functions as the source select line SGS (FIG. 1) and the gate electrodes of the plurality of source select transistors STS (FIG. 1) connected to this source select line SGS. The conductive film 112 functions as the lower wiring SC (FIG. 1). Moreover, an interlayer insulating film 101 such as silicon oxide ($SiO_2$) is provided between the conductive films 110, 111, 112.

The conductive films 110, 111 include a plurality of through-holes formed in a certain pattern, and the semiconductor film 120 and gate insulating film 130 are disposed inside this through-hole. End sections in the X direction of the conductive films 110 are connected to contacts CC that extend in the Z direction.

The conductive film 112 includes: a semiconductor film 113 connected to the semiconductor film 120; and a conductive film 114 provided on a lower surface of the semiconductor film 113. The semiconductor film 113 is a conductive semiconductor film such as polycrystalline silicon implanted with an n type impurity such as phosphorus, for example. The conductive film 114 is, for example, a conductive film of polycrystalline silicon implanted with an n type impurity such as phosphorus, a conductive film of a metal such as tungsten (W), or a conductive film of a silicide, and so on.

Hereafter, a conductive film 110 included in the memory layer MLa, of the plurality of conductive films 110 will sometimes be written as "conductive film 110a", or the like. Moreover, a conductive film 110 included in the memory layer MLb, of the plurality of conductive films 110 will sometimes be written as "conductive film 110b", or the like. Moreover, a conductive film 110 included in the memory layer MLc, of the plurality of conductive films 110 will sometimes be written as "conductive film 110c", or the like.

The semiconductor film 120 functions as the channel regions of the plurality of memory cells MC, the drain select transistor STD, and the source select transistor STS that are arranged in the Z direction, and so on. The semiconductor film 120 is a semiconductor film of the likes of non-doped polycrystalline silicon, for example. Moreover, an insulating film 140 of silicon oxide or the like is embedded in a central portion of the semiconductor film 120.

Hereafter, a semiconductor film 120 and insulating film 140 included in the memory layer MLa, of the plurality of semiconductor films 120 and insulating films 140 will sometimes be written as "semiconductor film 120a" and "insulating film 140a", or the like. Moreover, a semiconductor film 120 and insulating film 140 included in the memory layer MLb, of the plurality of semiconductor films 120 and insulating films 140 will sometimes be written as "semiconductor film 120b" and "insulating film 140b", or the like. Moreover, a semiconductor film 120 and insulating film 140 included in the memory layer MLc, of the plurality of semiconductor films 120 and insulating films 140 will sometimes be written as "semiconductor film 120c" and "insulating film 140c", or the like.

The semiconductor film 120a is connected at its lower end section to the semiconductor film 113, and is connected at its upper end section to a lower end section of the semiconductor film 120c. The semiconductor film 120c is connected at its upper end section to the semiconductor film 120b. The semiconductor film 120b is connected at its upper end section to the semiconductor film 102, and is connected to the bit line BL via this semiconductor film 102. The semiconductor film 102 is a conductive semiconductor film of the likes of polycrystalline silicon implanted with an n type impurity such as phosphorus, for example.

The gate insulating film 130 is a gate insulating film that includes, for example, the likes of a charge accumulating film of silicon nitride ($Si_3N_4$), and so on.

Hereafter, a gate insulating film 130 included in the memory layer MLa, of the gate insulating films 130 will sometimes be written as "gate insulating film 130a", or the like. Moreover, a gate insulating film 130 included in the memory layer MLb, of the gate insulating films 130 will sometimes be written as "gate insulating film 130b", or the like. Moreover, a gate insulating film 130 included in the memory layer MLc, of the gate insulating films 130 will sometimes be written as "gate insulating film 130c", or the like.

The gate insulating film 130a is connected at its upper end section to a lower end section of the gate insulating film 130c. The gate insulating film 130c is connected at its upper end section to a lower end section of the gate insulating film 130b.

Hereafter, a substantially circular column shaped configuration including the likes of the semiconductor films 120a, 120b, 120c, the gate insulating films 130a, 130b, 130c, the insulating films 140a, 140b, 140c, and the semiconductor film 102 will sometimes be written as "memory structure MH", or the like.

Figure 3:
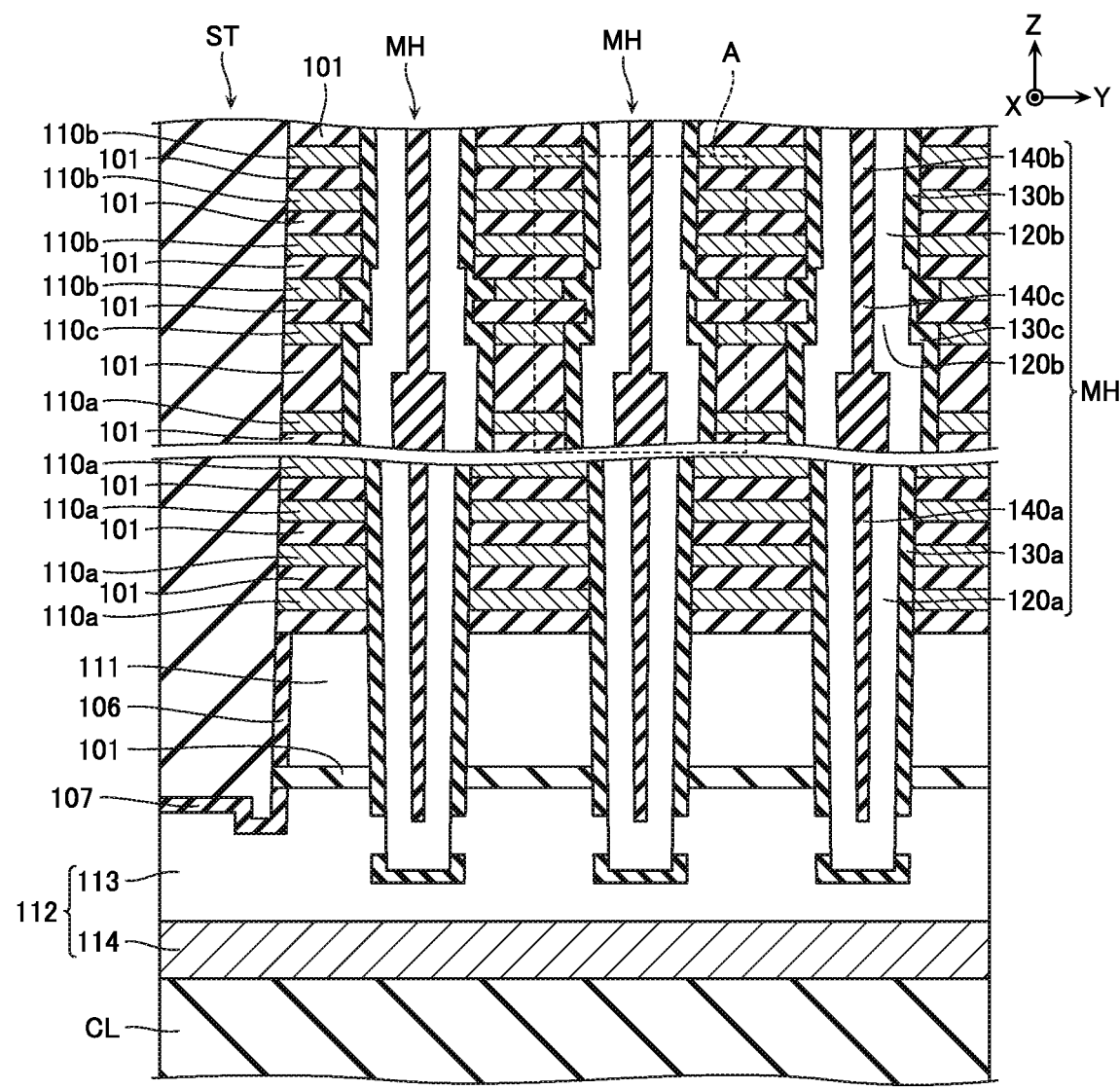
FIG. 3 is a schematic cross-sectional view showing a configuration of part of same semiconductor memory device.
Figure 4:
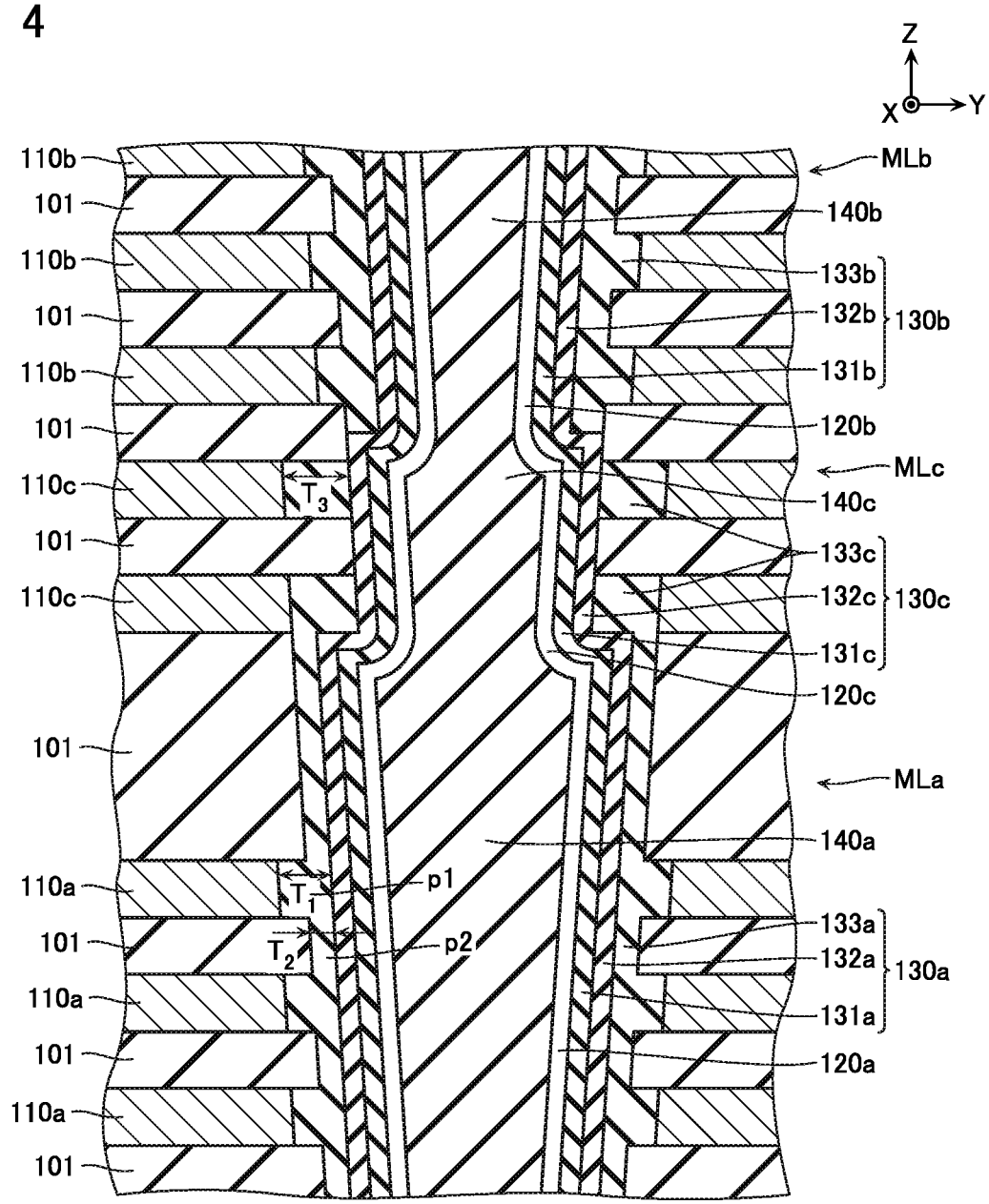
FIG. 4 is an enlarged view of a portion indicated by A of FIG. 3.

FIG. 3 is a schematic YZ cross-sectional view showing a more specific configuration example of a structure exemplified in FIG. 2. FIG. 4 is a schematic enlarged view of a portion indicated by A of FIG. 3. Note that for convenience of description, part of a configuration is omitted in FIGS. 3 and 4.

The semiconductor films 120a, 120b, 120c each have a substantially cylindrical shape extending in the Z direction. Moreover, outer diameters of the semiconductor films 120a, 120b become smaller as approaching the substrate. That is, outer diameters of lower end sections of the semiconductor films 120a, 120b are respectively smaller than outer diameters of upper end sections of the semiconductor films 120a, 120b. Moreover, a width in the Z direction of the semiconductor film 120c is smaller than widths in the Z direction of the semiconductor films 120a, 120b. Moreover, an outer diameter of the semiconductor film 120c is larger than the outer diameters of the lower end sections of the semiconductor films 120a, 120b, and smaller than the outer diameters of the upper end sections of the semiconductor films 120a, 120b. Moreover, in the example illustrated, a step is formed in a connecting portion of the semiconductor films 120a, 120c and in a connecting portion of the semiconductor films 120c, 120b.

As shown in FIG. 4, the gate insulating films 130a, 130b, 130c respectively include tunnel insulating films 131a, 131b, 131c of silicon oxide or the like, charge accumulating films 132a, 132b, 132c of silicon nitride or the like, and block insulating films 133a, 133b, 133c of silicon oxide or the like. The tunnel insulating films 131a, 131b, 131c, the charge accumulating films 132a, 132b, 132c, and the block insulating films 133a, 133b extend in the Z direction.

The tunnel insulating films 131a, 131b, 131c and the charge accumulating films 132a, 132b, 132c are respectively provided along outer circumferential surfaces of the semiconductor films 120a, 120b, 120c, and respectively have substantially the same shapes as the semiconductor films 120a, 120b, 120c. Moreover, in the example illustrated, an upper end section of the charge accumulating film 132a is connected to a lower surface of the block insulating film 133c. Moreover, an upper end section of the charge accumulating film 132c is connected to a lower end section of the block insulating film 133b.

The block insulating films 133a, 133b each have a substantially cylindrical shape extending in the Z direction. Moreover, outer diameters of the block insulating films 133a, 133b become smaller as approaching the substrate. Moreover, the block insulating films 133a, 133b respectively include: a first portion p1 provided on inner circumferential surfaces of through-holes provided in the conductive films 110a, 110b; and a second portion p2 provided on inner circumferential surfaces of through-holes provided in the interlayer insulating films 101. A thickness $T_1$ in the radial direction of the first portion p1 is larger than a thickness $T_2$ in the radial direction of the second portion p2.

The block insulating films 133c each have a substantially ring-like shape. An outer diameter of the block insulating film 133c is larger than an outer diameter of the lower end section of the block insulating film 133b. In the example illustrated, two of the block insulating films 133c are provided corresponding to the two conductive films 110c. When two or more block insulating films 133c are provided in this way, these block insulating films 133c are arranged separated in the Z direction. Moreover, in the example illustrated, the most downwardly positioned block insulating film 133c is connected to an upper end of the block insulating film 133a. Moreover, the most upwardly positioned block insulating film 133c is disposed separated from a lower end of the block insulating film 133b. A thickness $T_3$ in the radial direction of the block insulating film 133c is of the same degree as the above-mentioned thickness $T_1$.

Note that in the description below, the tunnel insulating films 131a, 131b, 131c will sometimes be collectively called a tunnel insulating film 131. Similarly, the charge accumulating films 132a, 132b, 132c will sometimes be collectively called a charge accumulating film 132. Similarly, the block insulating films 133a, 133b, 133c will sometimes be collectively called a block insulating film 133.

[Method of Manufacturing]

Next, a method of manufacturing the semiconductor memory device according to the present embodiment will be described with reference to FIGS. 5-22.

Figure 5:
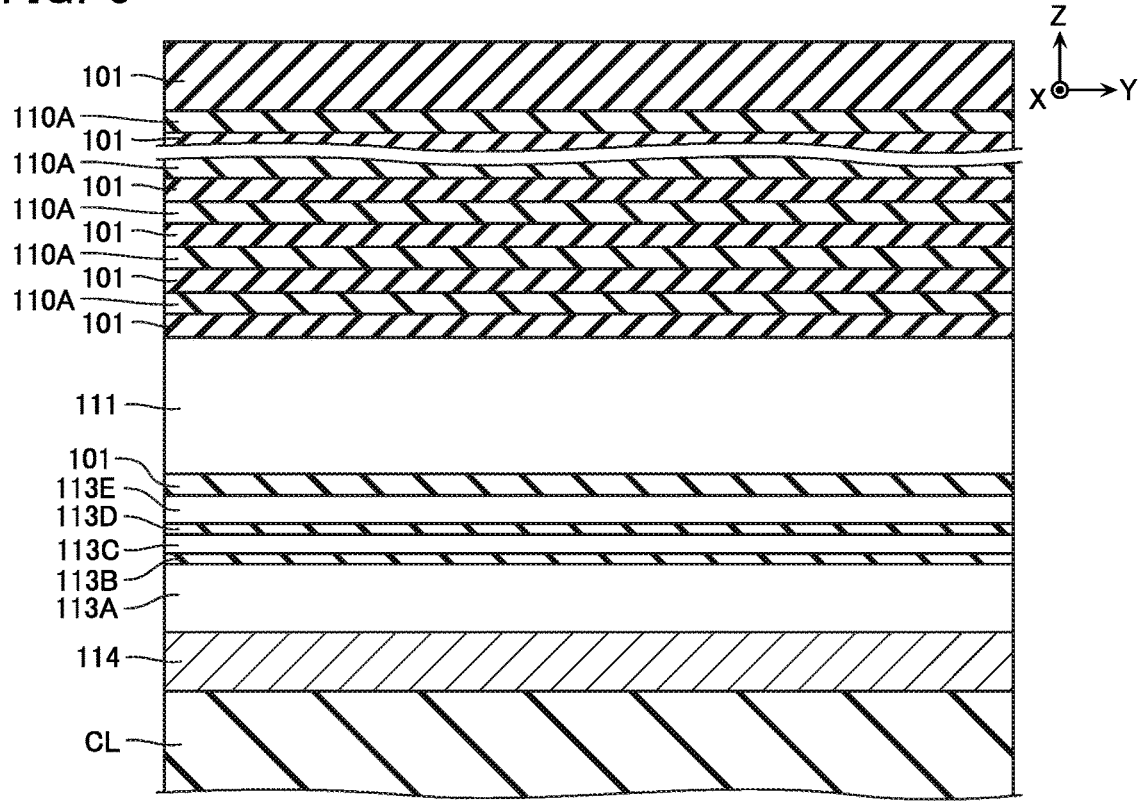
FIG. 5 is a schematic cross-sectional view showing a method of manufacturing same semiconductor memory device.

As shown in FIG. 5, in same method of manufacturing, above the circuit layer CL, the conductive film 114, a semiconductor film 113A of silicon or the like, an insulating film 113B of silicon oxide or the like, a semiconductor film 113C of silicon or the like, an insulating film 113D of silicon oxide or the like, and a semiconductor film 113E of silicon or the like, are formed. Moreover, above these, the interlayer insulating film 101 and the conductive film 111 are formed. Moreover, above these, a plurality of the interlayer insulating films 101 and sacrifice films 110A of silicon nitride or the like, that correspond to the memory layer MLa are alternately formed. This step is performed by a method such as PECVD (Plasma-Enhanced Chemical Vapor Deposition), for example.

Figure 6:
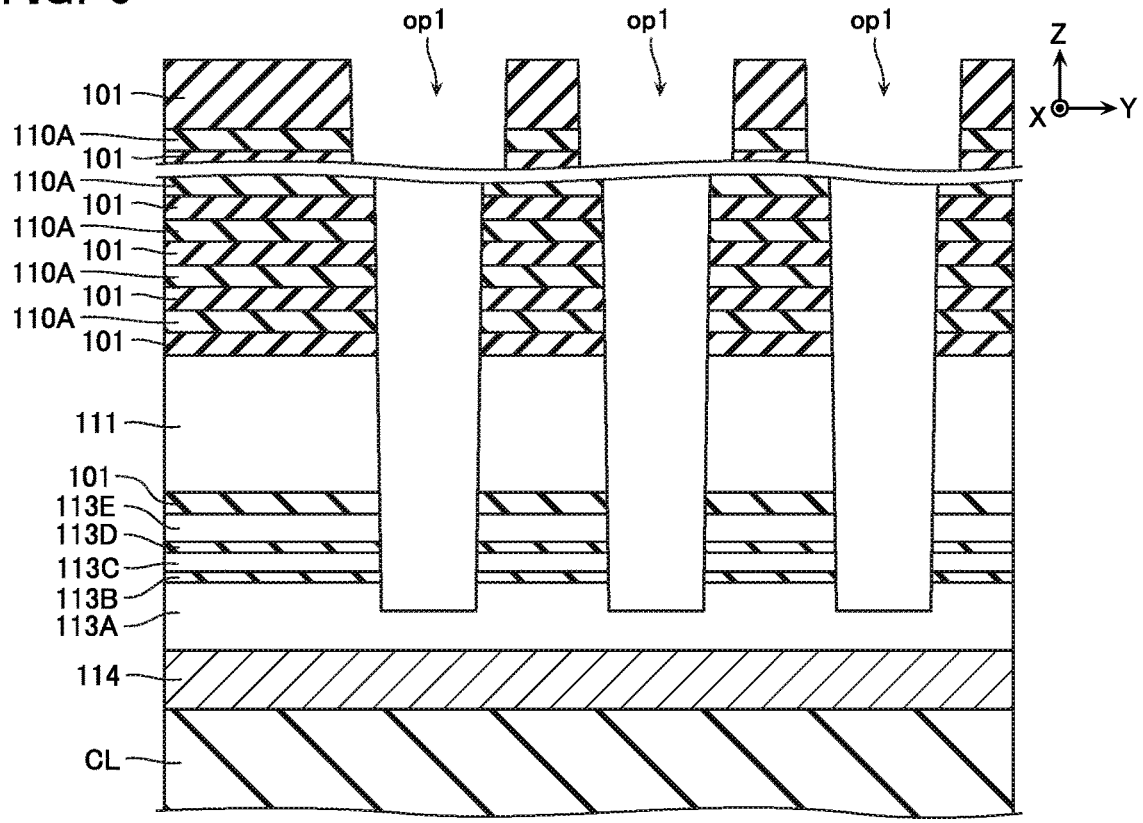
FIG. 6 is a schematic cross-sectional view showing same method of manufacturing.

Next, as shown in FIG. 6, an opening op1 is formed. The opening op1 is an opening that extends in the Z direction and penetrates the sacrifice films 110A, the interlayer insulating films 101, the conductive film 111, the semiconductor film 113E, the insulating film 113D, the semiconductor film 113C, and the insulating film 113B to expose the semiconductor film 113A. This step is performed by a method such as RIE (Reactive Ion Etching), for example.

Figure 7:
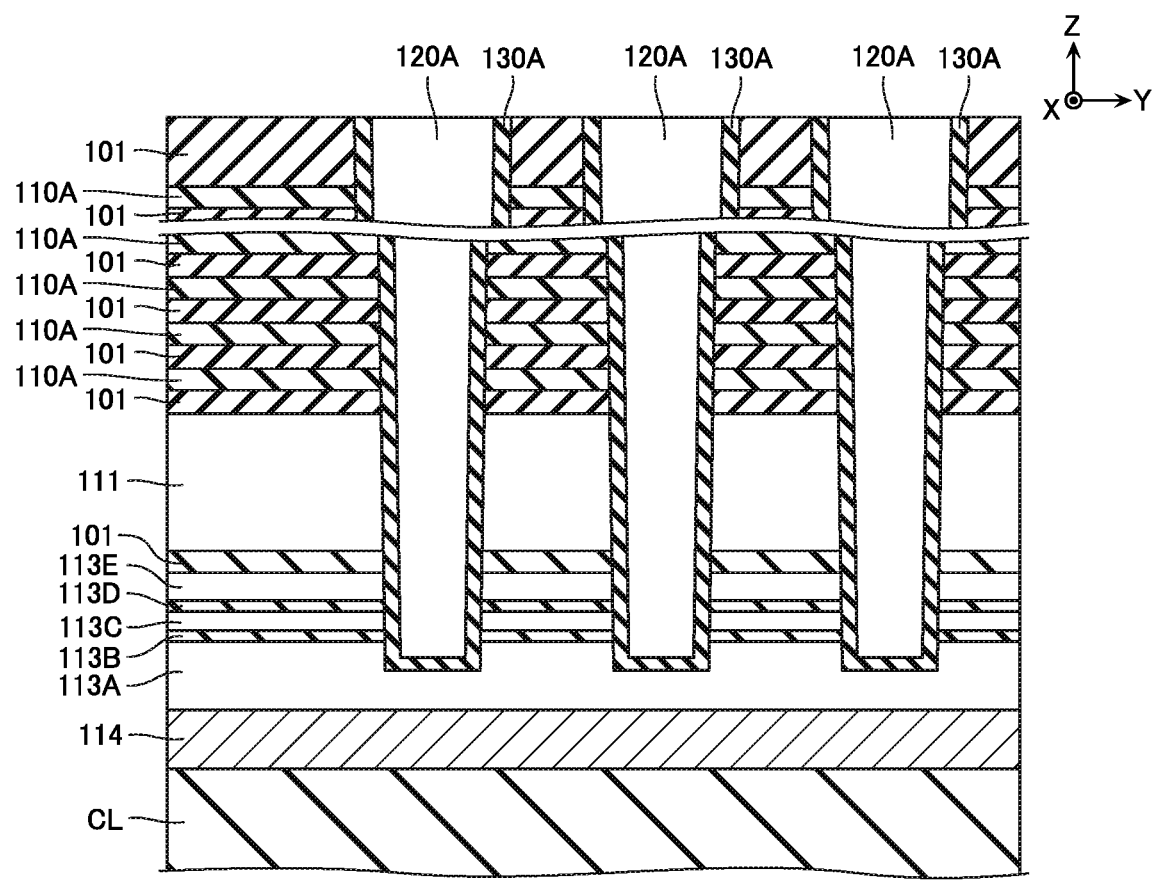
FIG. 7 is a schematic cross-sectional view showing same method of manufacturing.

Next, as shown in FIG. 7, a cover film 130A of silicon nitride or the like and a sacrifice film 120A of silicon or the like, are formed on an inside of the opening op1. This step is performed by, for example, forming the cover film 130A and the sacrifice film 120A by LPCVD (Low-Pressure Chemical Vapor Deposition) or the like, and exposing an upper surface of an uppermost layer interlayer insulating film 101 by RIE or the like.

Figure 8:
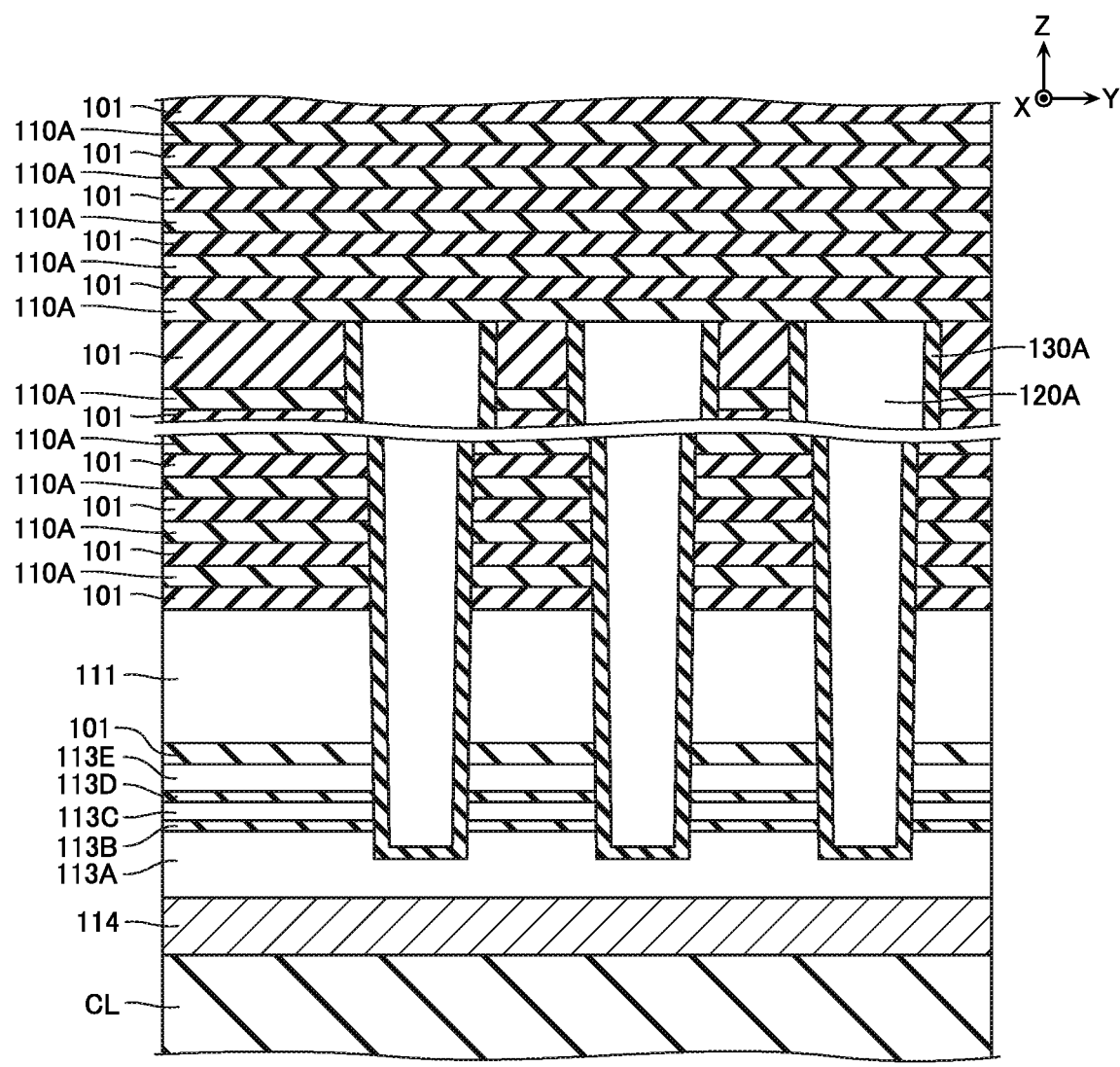
FIG. 8 is a schematic cross-sectional view showing same method of manufacturing.

Next, as shown in FIG. 8, a plurality of the interlayer insulating films 101 and the sacrifice films 110A that correspond to the memory layers MLc, MLb, are alternately formed. This step is performed by a method such as PECVD, for example.

Figure 9:
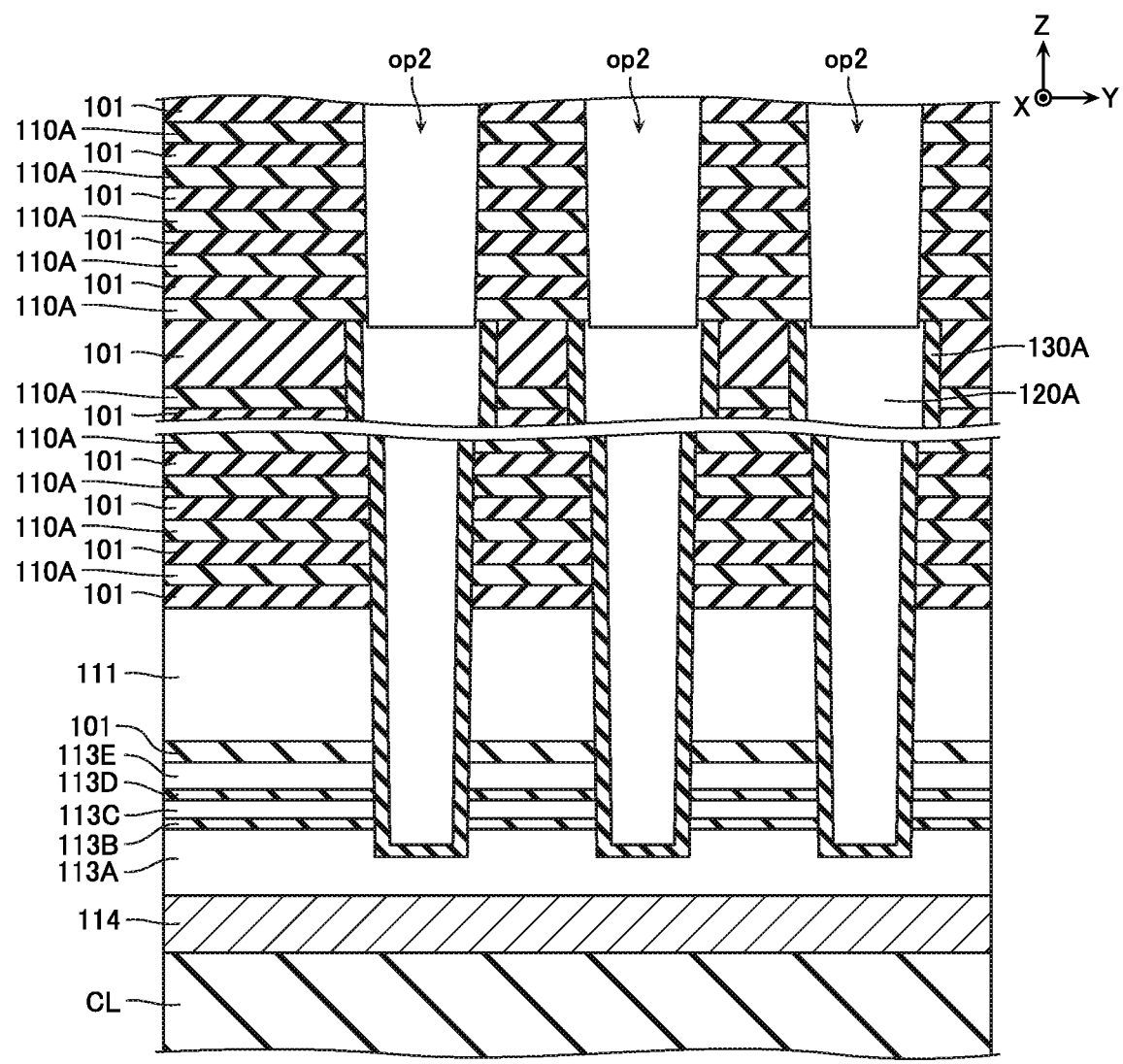
FIG. 9 is a schematic cross-sectional view showing same method of manufacturing.

Next, as shown in FIG. 9, an opening op2 is formed. The opening op2 is an opening that extends in the Z direction and penetrates the sacrifice films 110A and the interlayer insulating films 101 to expose the sacrifice film 120A. This step is performed by a method such as RIE, for example.

Figure 10:
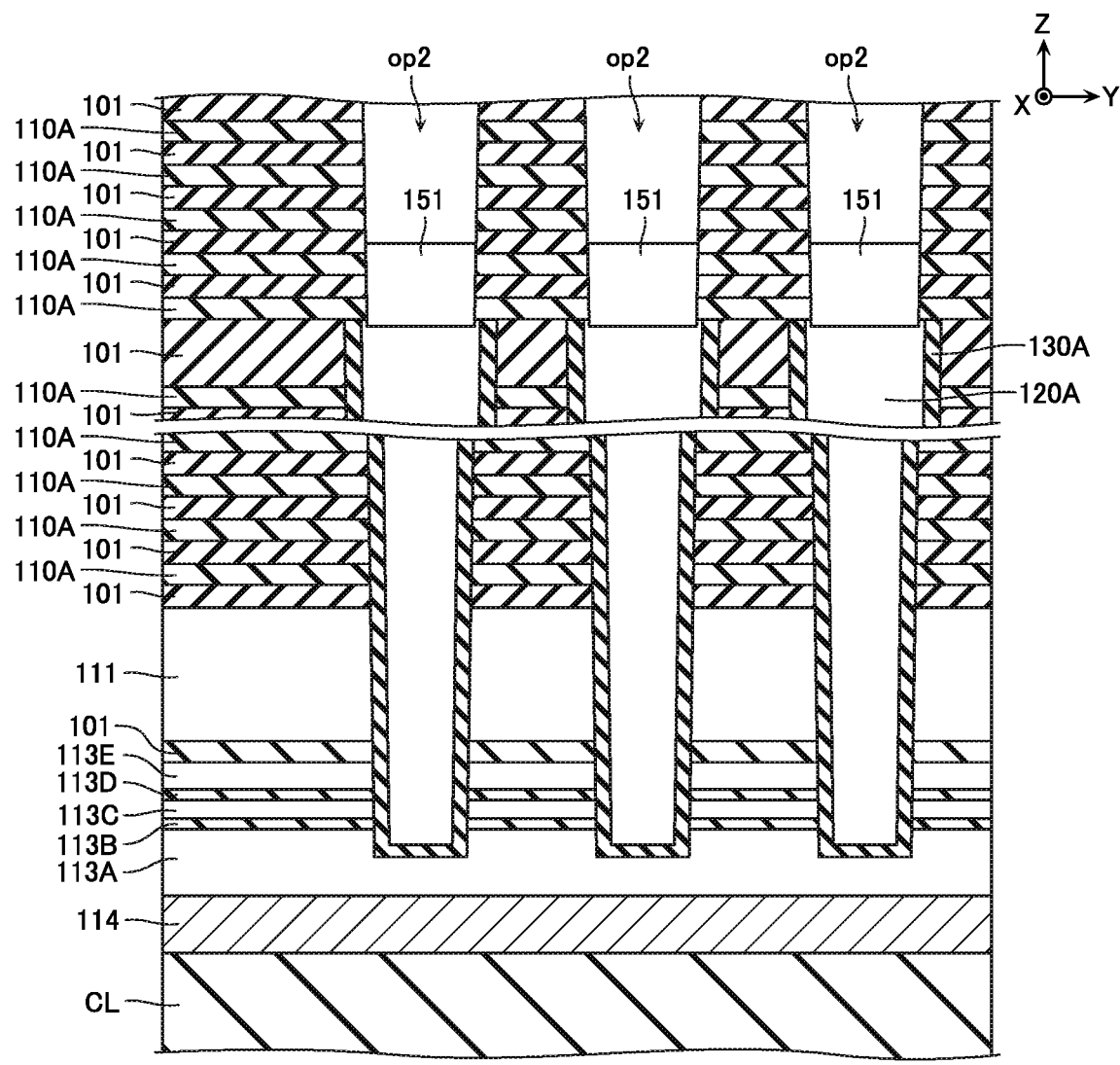
FIG. 10 is a schematic cross-sectional view showing same method of manufacturing.
Figure 11:
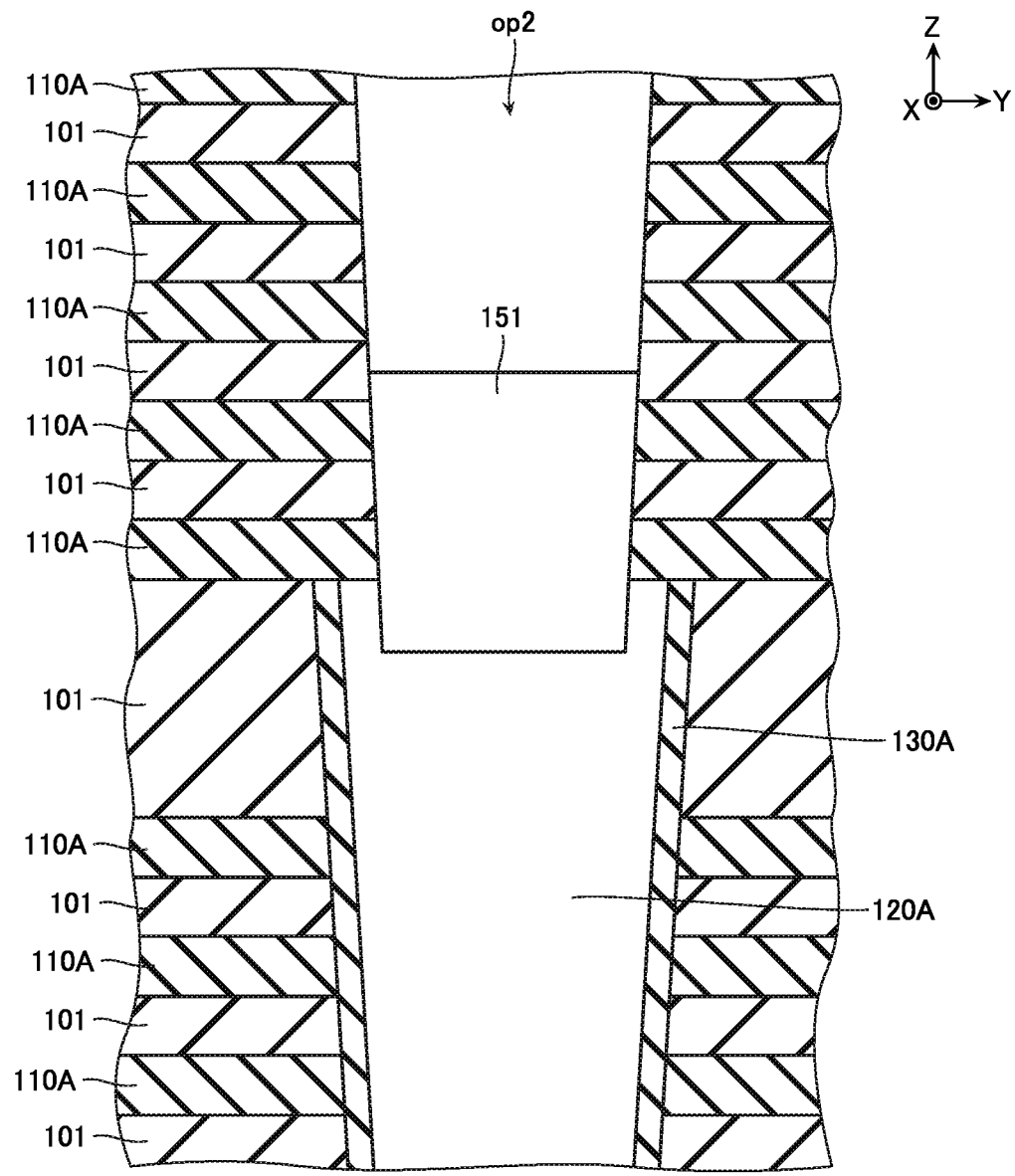
FIG. 11 is a schematic cross-sectional view showing same method of manufacturing.

Next, as shown in FIGS. 10 and 11, a sacrifice film 151 of silicon or the like, is formed. This step is performed by a method such as an epitaxial crystal growth method, for example. In this step, crystal growth is performed until an upper surface of the sacrifice film 151 reaches further in an upward direction than an upper surface of one or a plurality of the sacrifice films 110A, with reference to an upper surface of the sacrifice film 120A of silicon or the like, for example.

Figure 12:
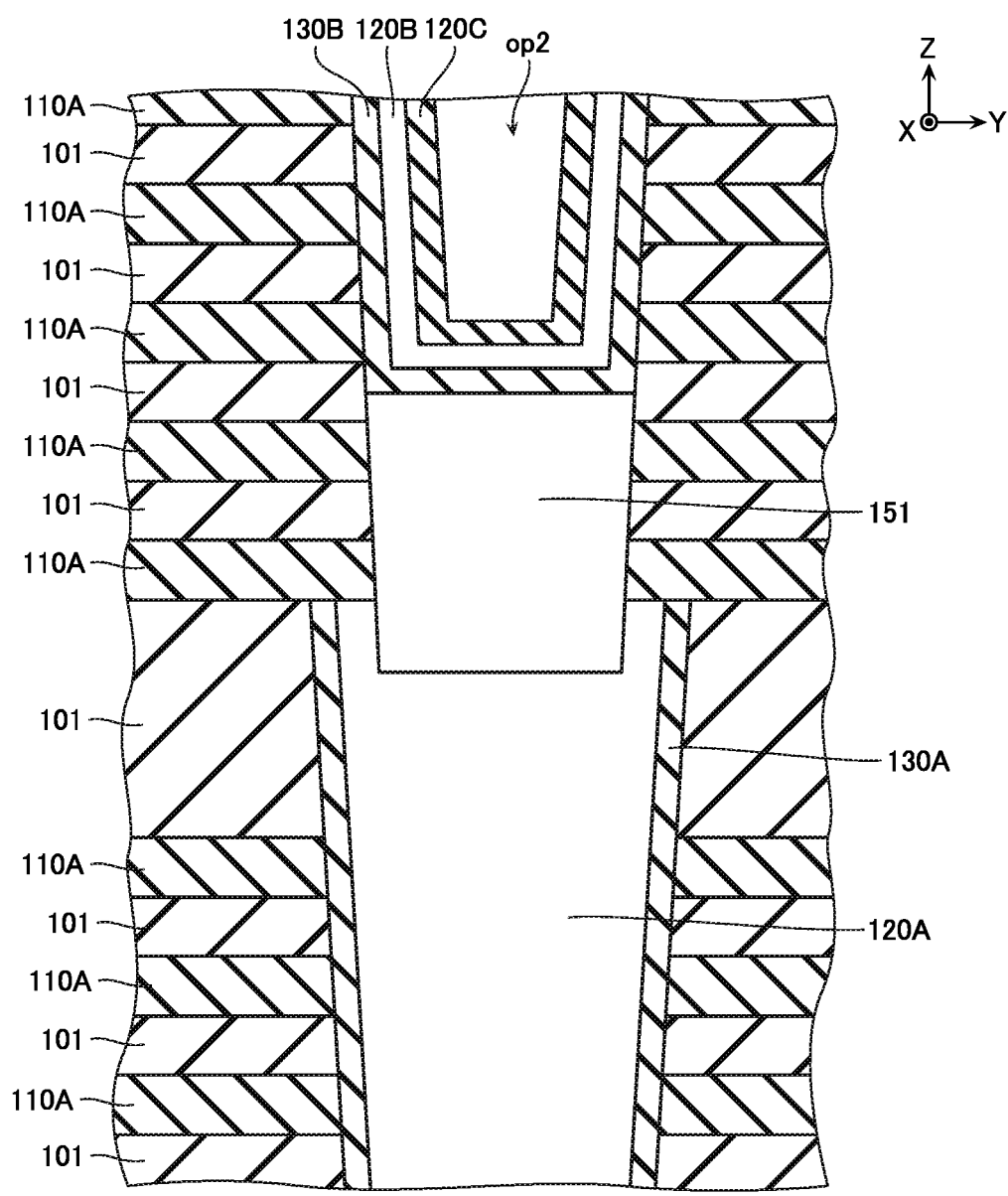
FIG. 12 is a schematic cross-sectional view showing same method of manufacturing.

Next, as shown in FIG. 12, a cover film 130B of silicon nitride or the like, a sacrifice film 120B of silicon or the like, and a cover film 120C of silicon oxide or the like, are formed on an inner circumferential surface of the opening op2 and the upper surface of the sacrifice film 151. This step is performed by a method such as LPCVD, for example.

Figure 13:
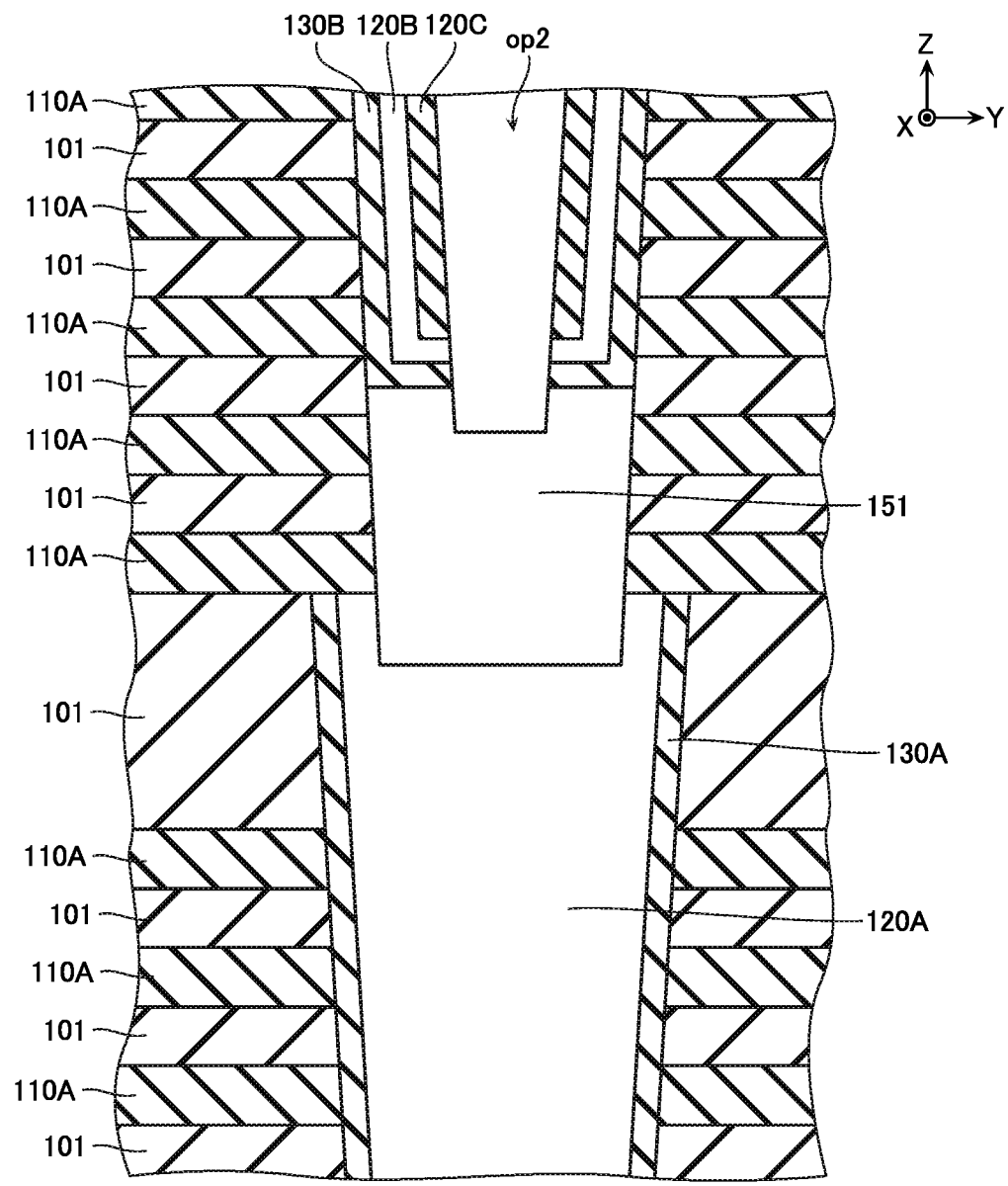
FIG. 13 is a schematic cross-sectional view showing same method of manufacturing.

Next, as shown in FIG. 13, portions of the cover film 130B, the sacrifice film 120B, and the cover film 120C formed on the upper surface of the sacrifice film 151 are removed. This step is performed by a method such as RIE, for example.

Figure 14:
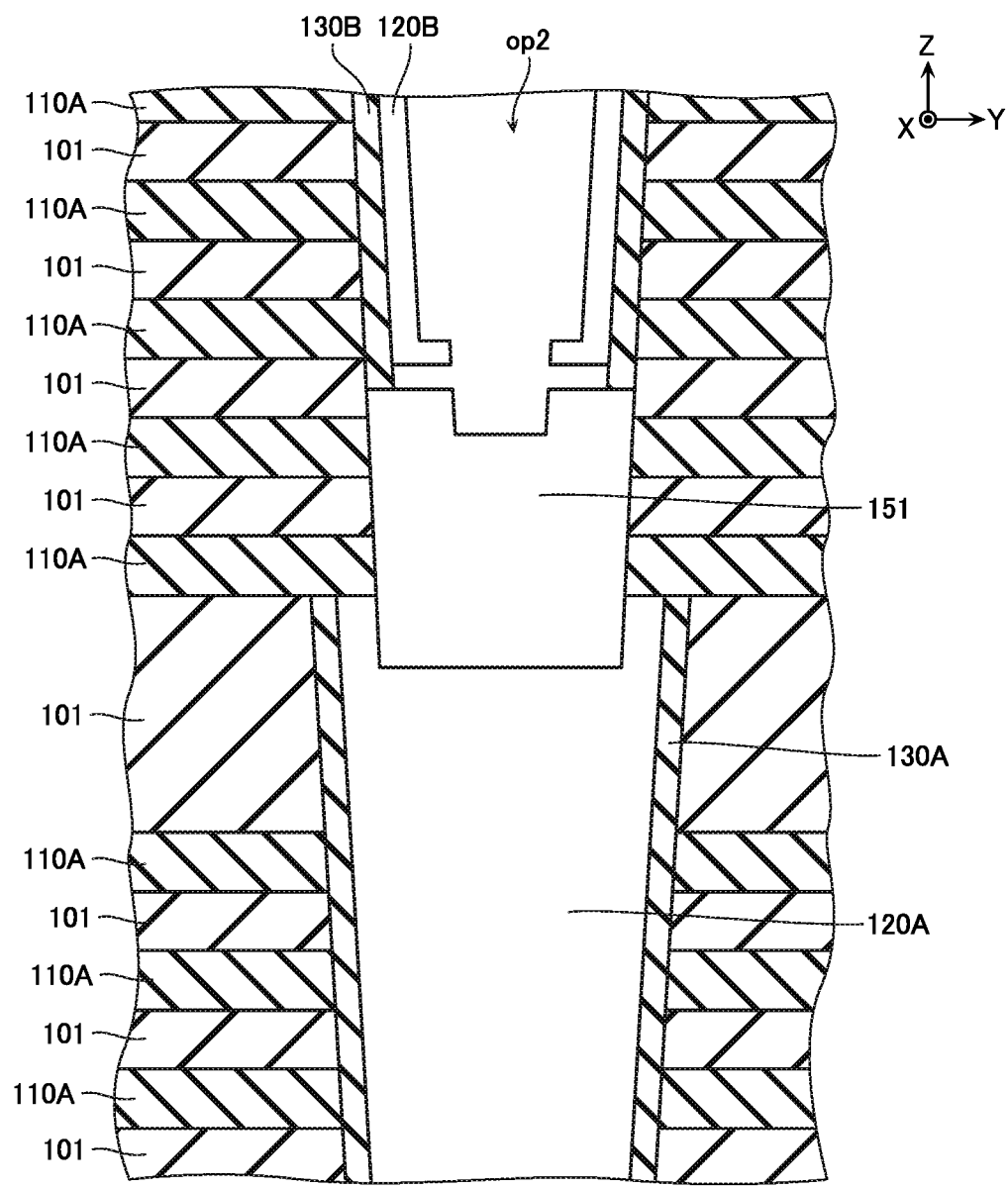
FIG. 14 is a schematic cross-sectional view showing same method of manufacturing.

Next, as shown in FIG. 14, the cover film 120C is removed. In addition, part of the cover film 130B is removed. This step is performed by a method such as wet etching, for example.

Figure 15:
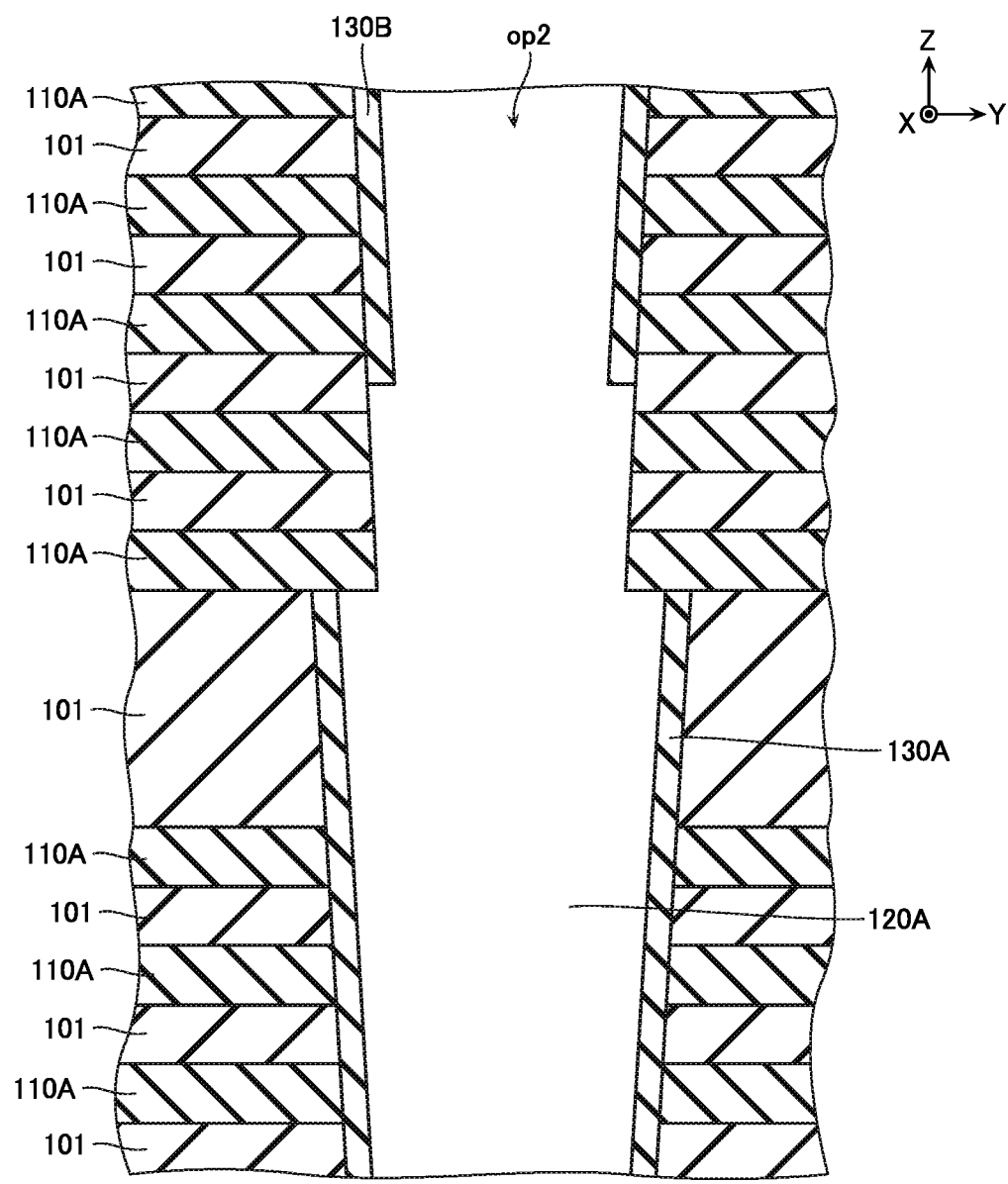
FIG. 15 is a schematic cross-sectional view showing same method of manufacturing.

Next, as shown in FIG. 15, the sacrifice film 120A, the sacrifice film 120B, and the sacrifice film 151 are removed. This step is performed by a method such as wet etching, for example.

Figure 16:
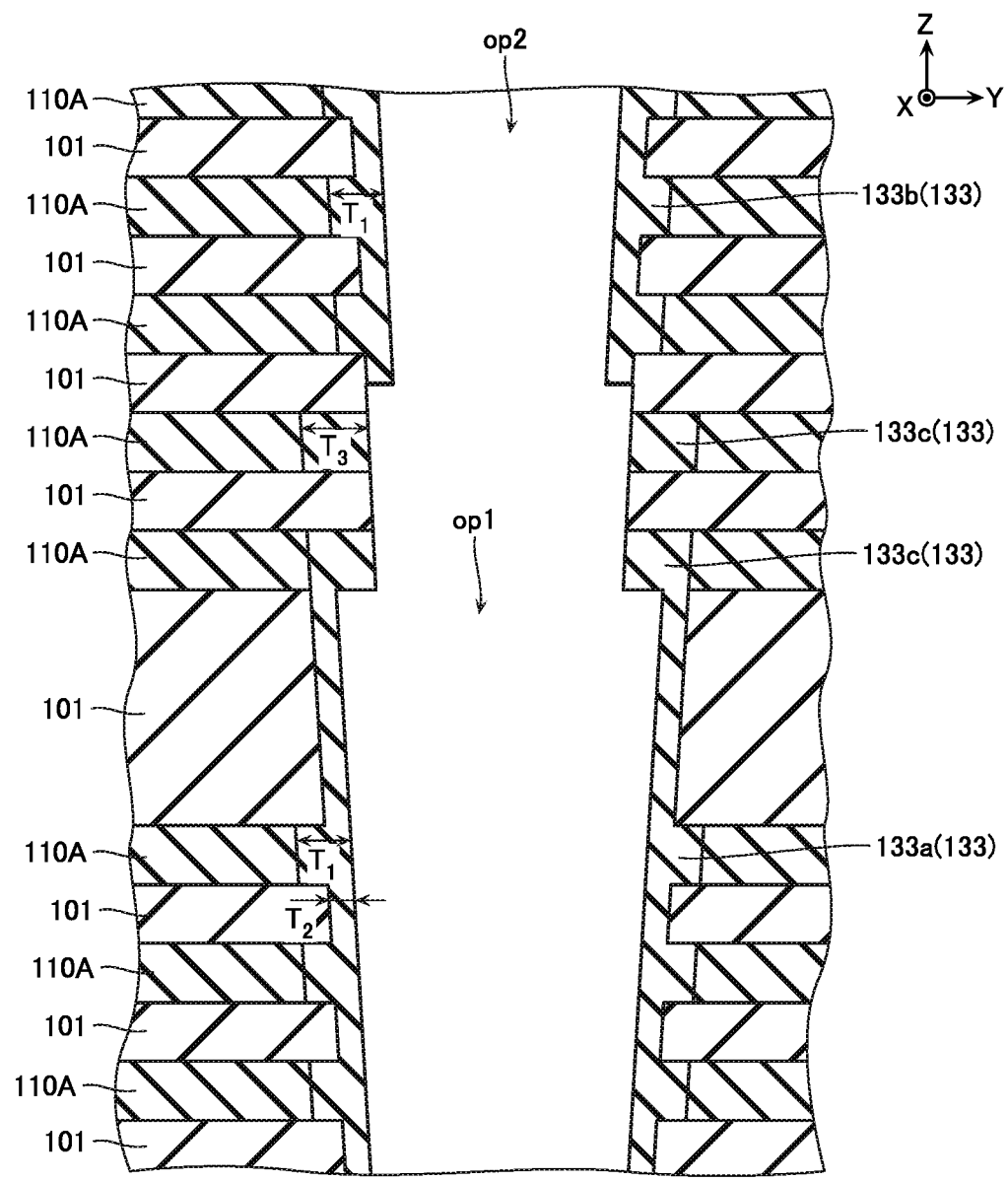
FIG. 16 is a schematic cross-sectional view showing same method of manufacturing.

Next, as shown in FIG. 16, the block insulating film 133 is formed. This step is performed by, for example, oxidation treatment on the cover film 130A, the cover film 130B, and part of the sacrifice film 110A.

Note that in the present embodiment, the sacrifice films 110A and the cover films 130A, 130B are both films of silicon nitride or the like. However, due to differences in methods of film formation, conditions of film formation, and so on, modes of oxidation sometimes differ between the sacrifice films 110A and the cover films 130A, 130B. In the present embodiment, for example, such differences in modes are taken into account to perform adjustment of film thicknesses and control of oxidation treatment of the cover films 130A, 130B such that the thickness $T_3$ in the radial direction of the block insulating film 133c will be of the same degree as the thickness $T_1$ in the radial direction of the block insulating films 133a, 133b.

Moreover, in the example of FIG. 15, the sacrifice films 110A corresponding to the memory layers MLa, MLb are covered by the cover films 130A, 130B. However, a vicinity of a contact surface with the cover films 130A, 130B is sometimes oxidized. Therefore, the thickness $T_1$ in the radial direction of a portion provided on an inner circumferential surface of a through-hole of the sacrifice film 110A, of the block insulating film 133 becomes larger than the thickness $T_2$ in the radial direction of a portion provided on an inner circumferential surface of a through-hole of the interlayer insulating film 101, of the block insulating film 133.

Figure 17:
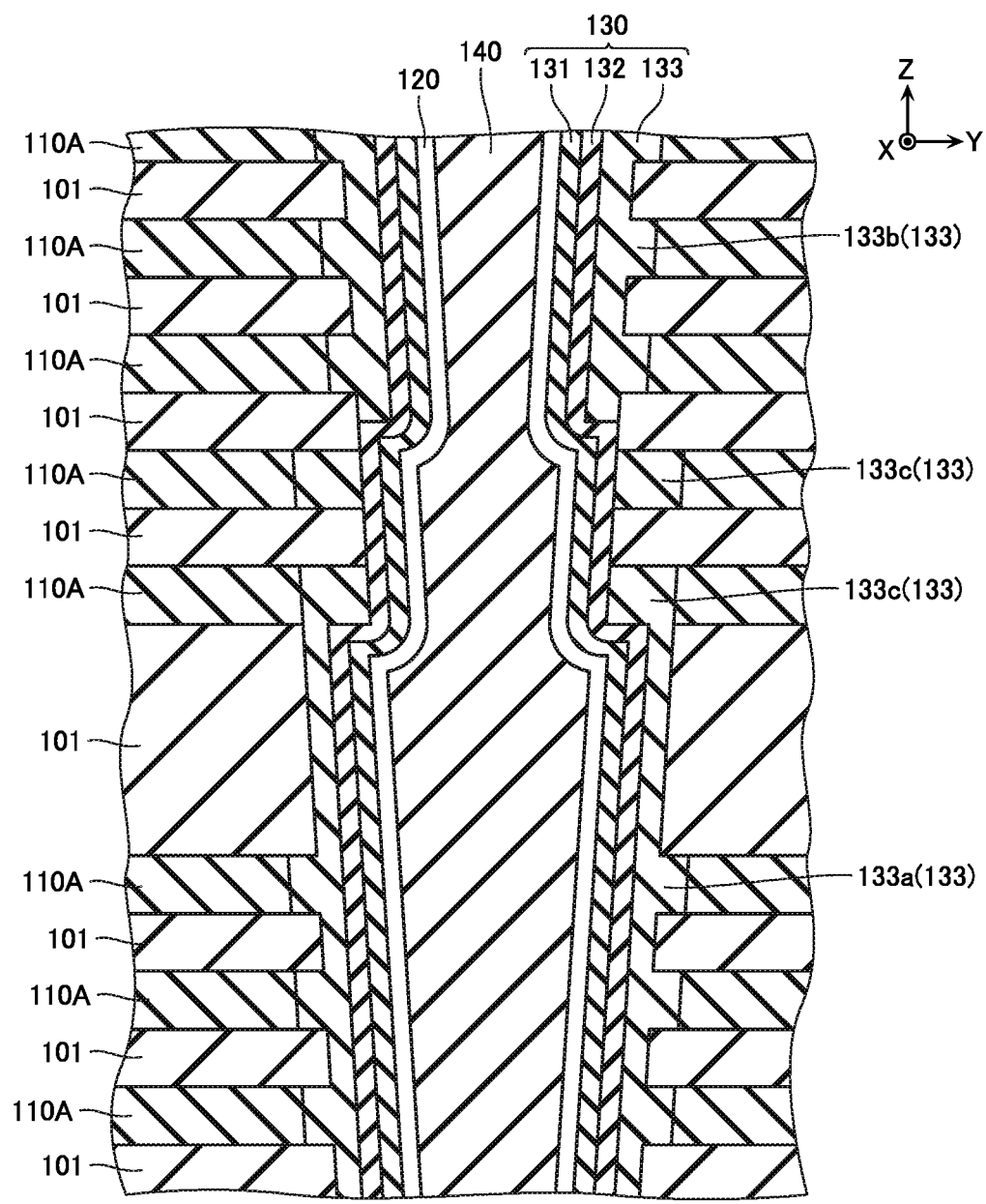
FIG. 17 is a schematic cross-sectional view showing same method of manufacturing.
Figure 18:
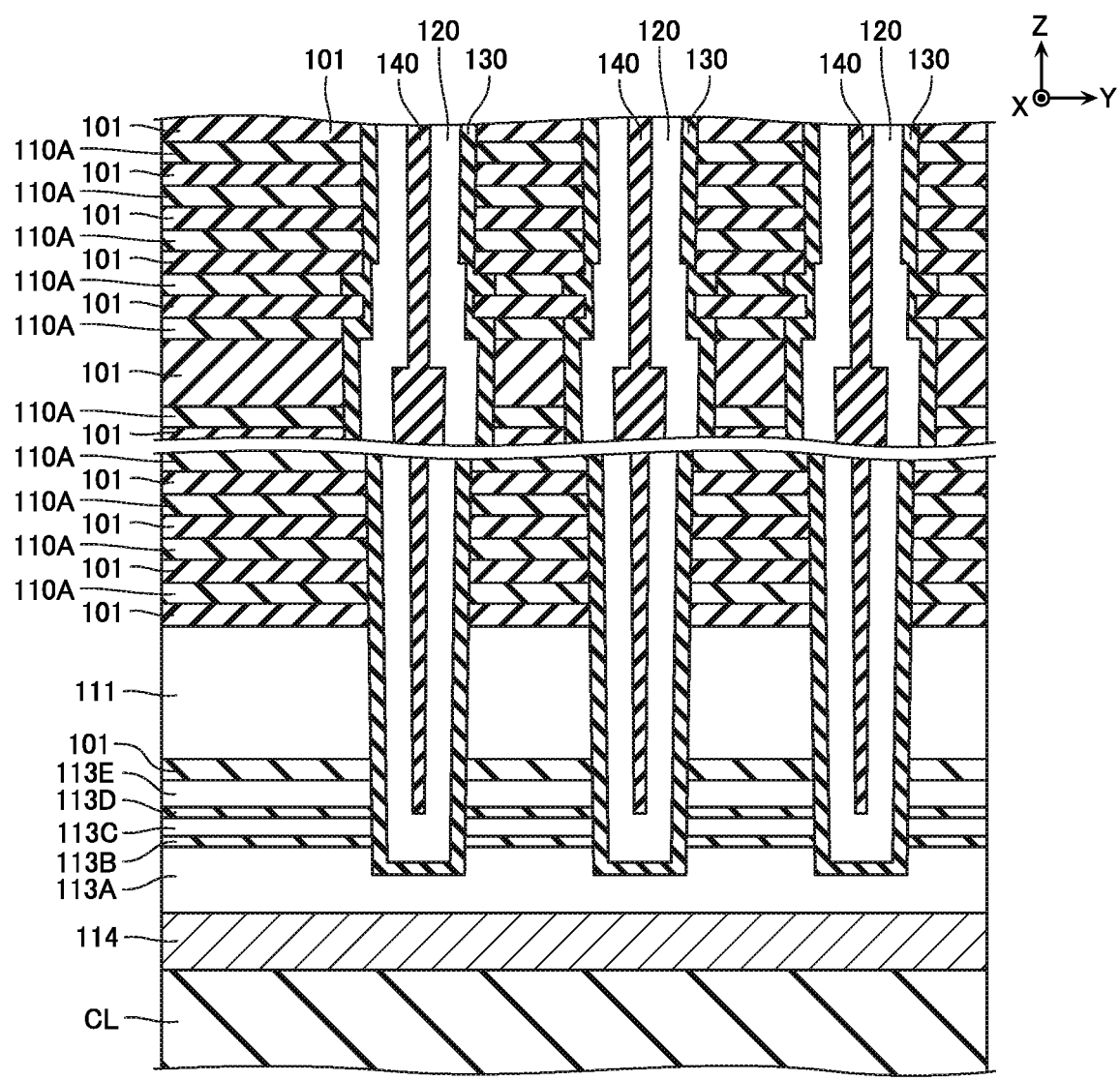
FIG. 18 is a schematic cross-sectional view showing same method of manufacturing.

Next, as shown in FIGS. 17 and 18, the gate insulating film 130, the semiconductor film 120, and the insulating film 140 are formed on insides of the openings op1, op2. This step is performed by a method such as LPCVD, for example.

Figure 19:
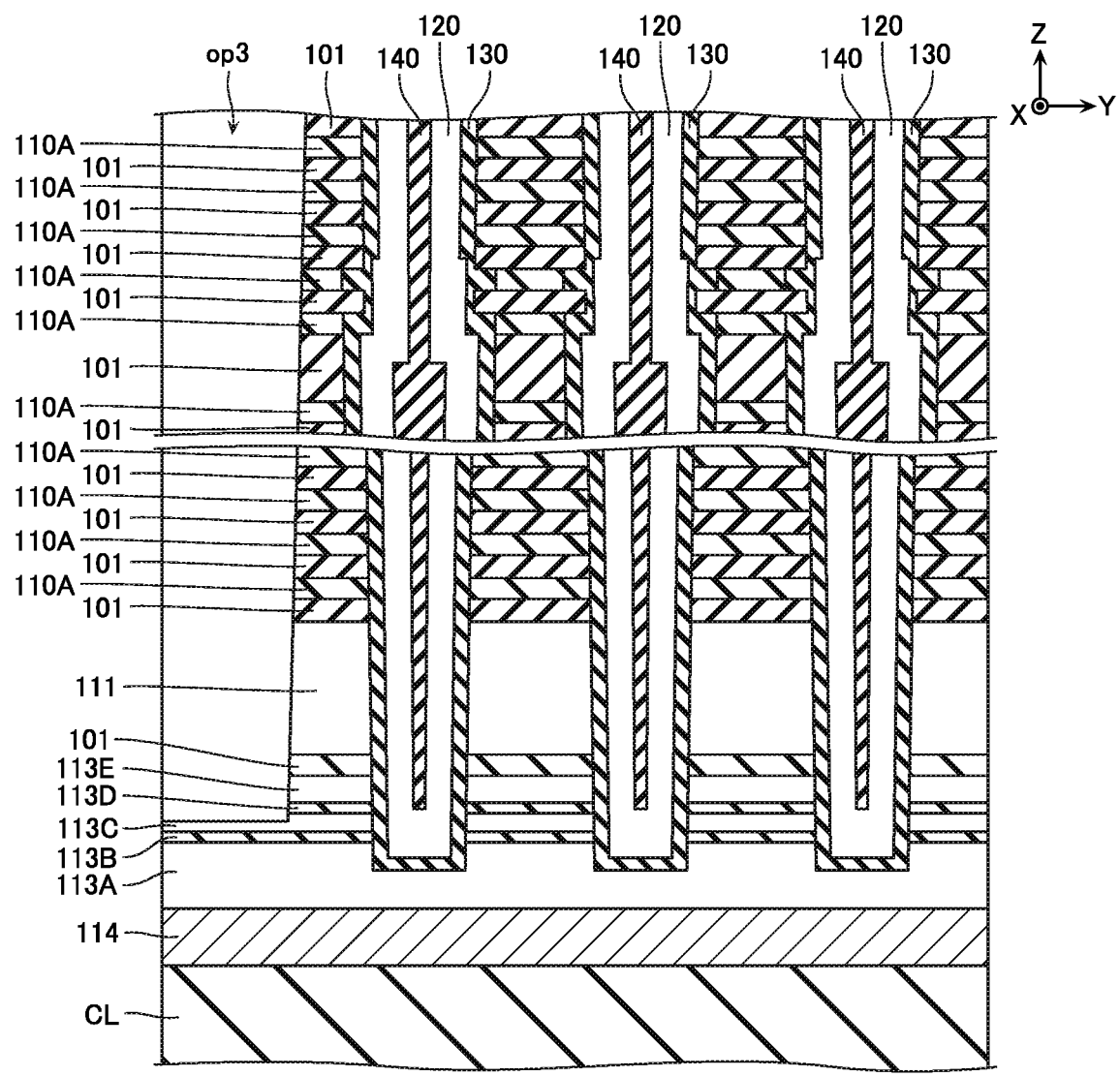
FIG. 19 is a schematic cross-sectional view showing same method of manufacturing.

Next, as shown in FIG. 19, an opening op3 is formed. The opening op3 is a trench that extends in the Z direction and the X direction, divides in the Y direction the sacrifice films 110A, the interlayer insulating films 101, the conductive film 111, the semiconductor film 113E, and the insulating film 113D, and exposes an upper surface of the semiconductor film 113C. This step is performed by a method such as RIE, for example.

Figure 20:
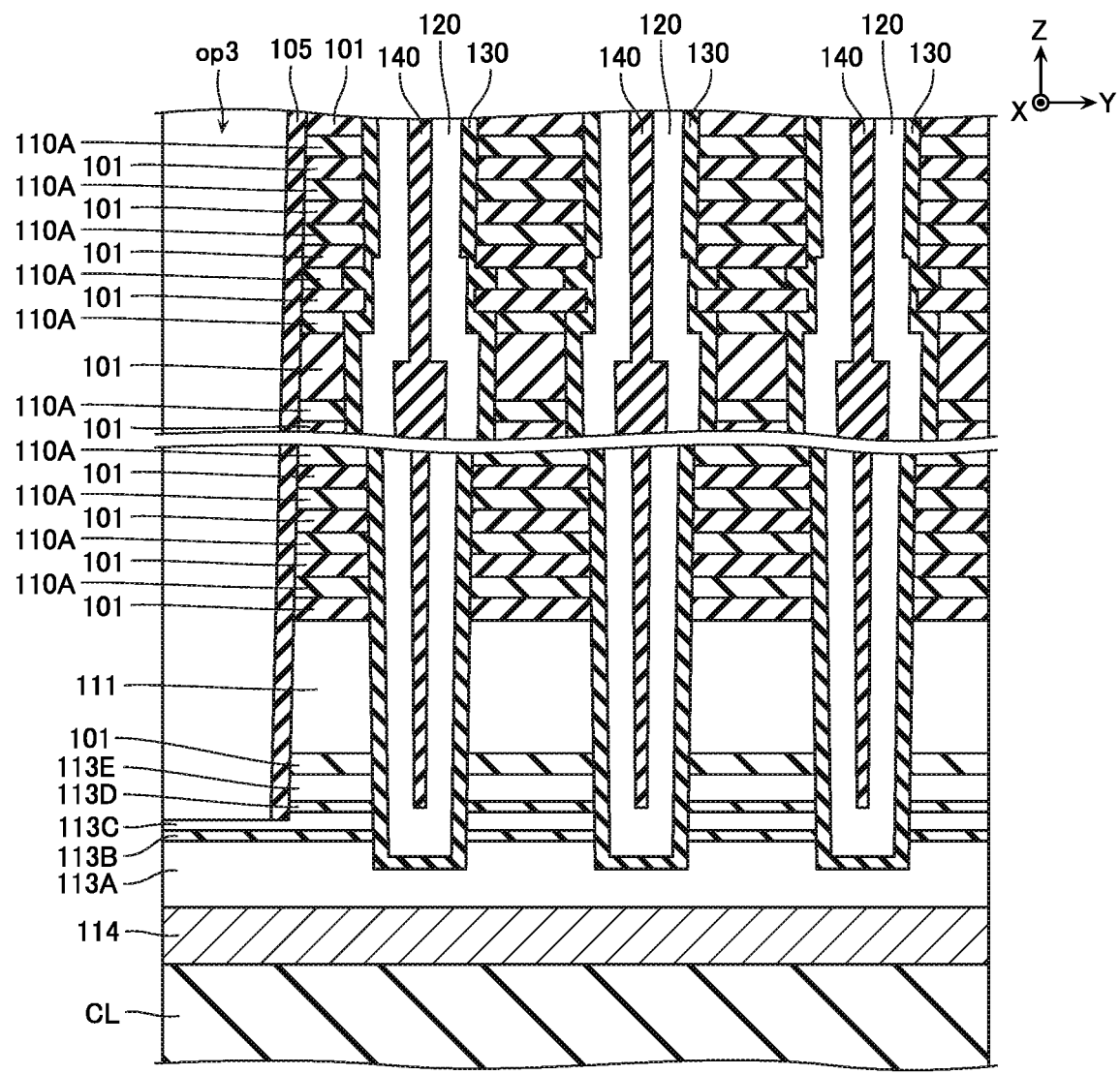
FIG. 20 is a schematic cross-sectional view showing same method of manufacturing.

Next, as shown in FIG. 20, an insulating film 105 of silicon nitride or the like is formed on a side surface in the Y direction of the opening op3. This step is performed by methods such as LPCVD and RIE, for example.

Figure 21:
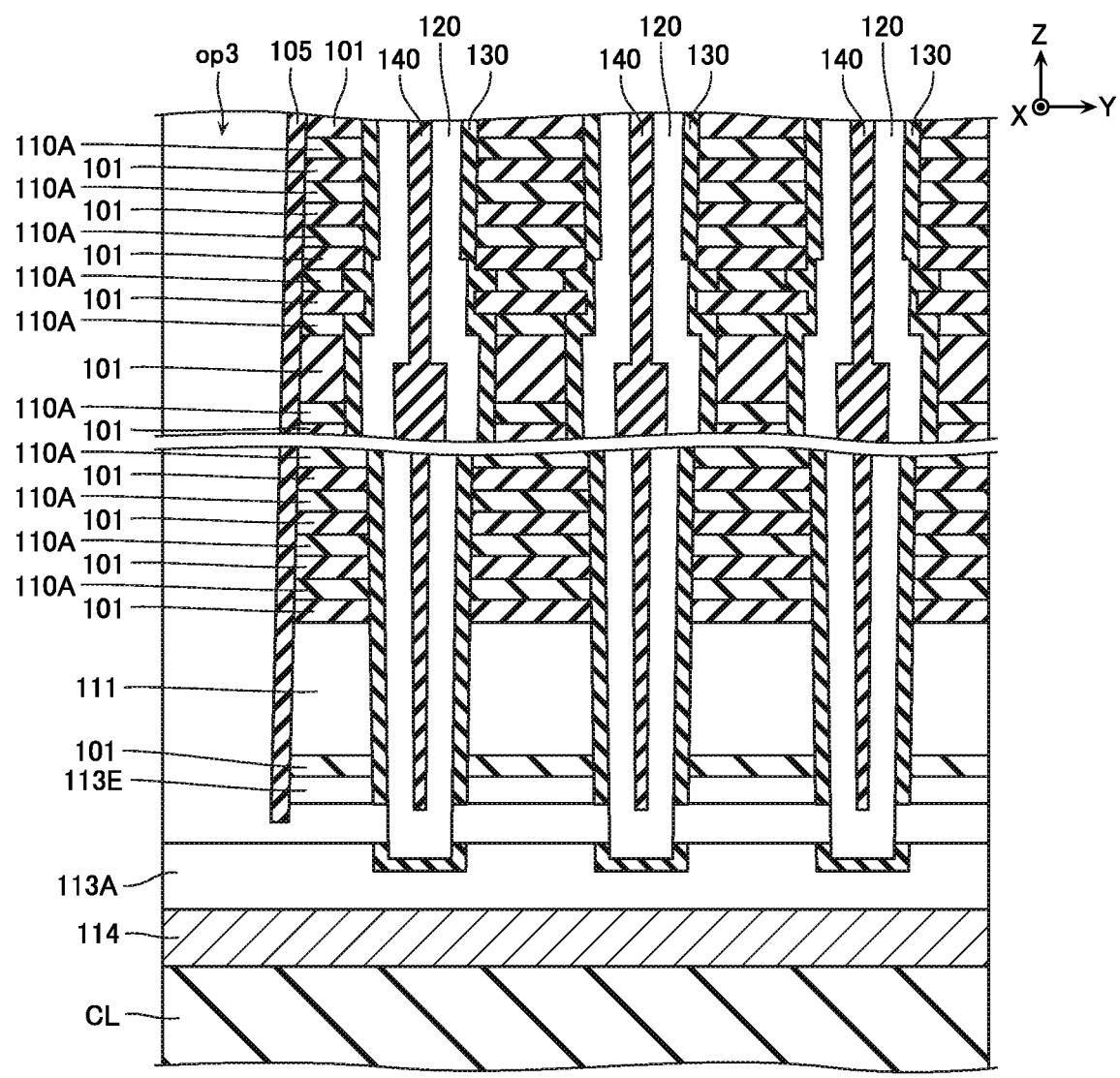
FIG. 21 is a schematic cross-sectional view showing same method of manufacturing.

Next, as shown in FIG. 21, the semiconductor film 113C, the insulating films 113B, 113D, and part of the gate insulating film 130 are removed to expose a lower end section of the semiconductor film 120. This step is performed by the likes of wet etching, for example.

Figure 22:
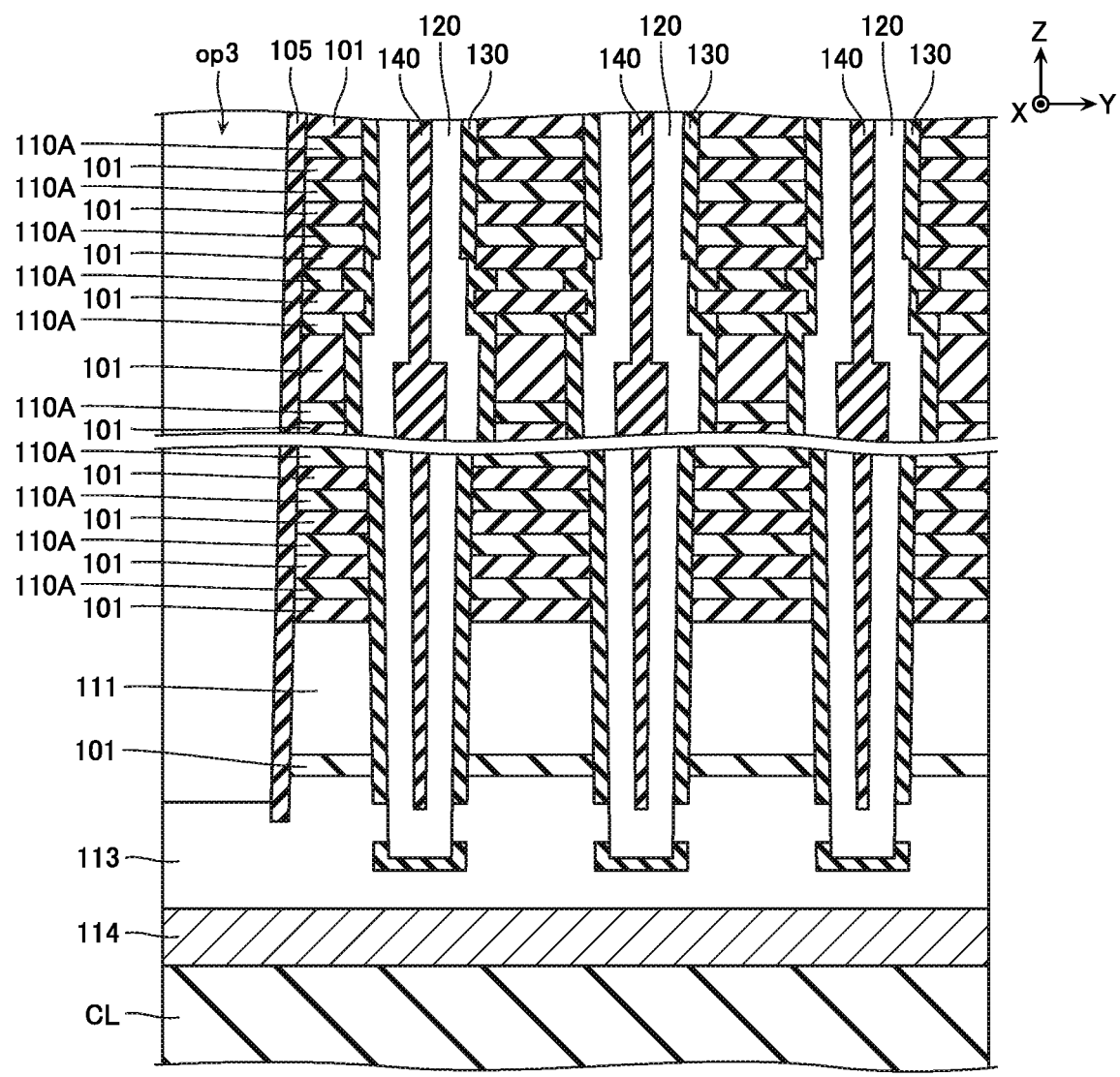
FIG. 22 is a schematic cross-sectional view showing same method of manufacturing.

Next, as shown in FIG. 22, a semiconductor film is formed on an upper surface of the semiconductor film 113A, a lower surface of the semiconductor film 113E, and part of an outer circumferential surface of the semiconductor film 120, thereby forming the semiconductor film 113. This step is performed by a method such as CVD or an epitaxial crystal growth method, for example.

Subsequently, the insulating film 105 is removed by a method such as wet etching, surfaces exposed to the opening op3 of the conductive film 111 and the semiconductor film 113 are selectively oxidized to form insulating films 106, 107 (FIG. 3), the sacrifice films 110A are removed by a method such as wet etching, the conductive film 110 is formed by a method such as CVD, and an insulating film ST (FIG. 2) is formed in the opening op3 by a method such as CVD, whereby the configuration described with reference to FIGS. 3 and 4 is formed.

Comparative Example

Figure 23:
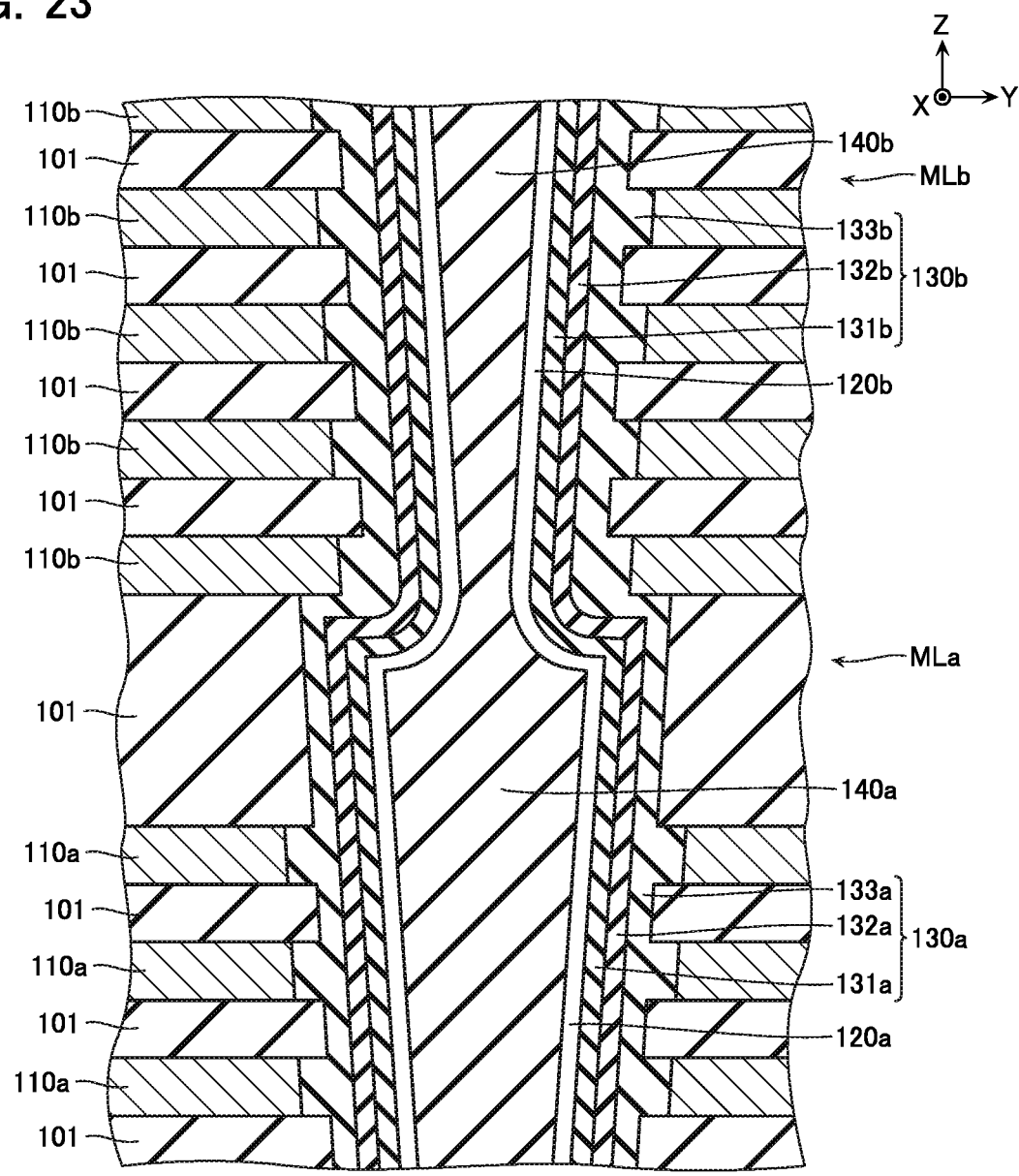
FIG. 23 is a schematic cross-sectional view for describing a semiconductor memory device according to a comparative example.

Next, a comparative example will be described. FIG. 23 is a schematic cross-sectional view showing a configuration of a semiconductor memory device according to the comparative example.

As shown in FIG. 23, the semiconductor memory device according to the comparative example does not include the memory layer MLc, and has upper end sections of the semiconductor film 120a, the tunnel insulating film 131a, the charge accumulating film 132a, the block insulating film 133a, and the insulating film 140a in the memory layer MLa connected to lower end sections of the semiconductor film 120b, the tunnel insulating film 131b, the charge accumulating film 132b, the block insulating film 133b, and the insulating film 140b in the memory layer MLb.

[Advantages of First Embodiment]

The outer circumferential surface of the semiconductor films 120a, 120b is surrounded by the inner circumferential surface of the through-hole provided in the conductive films 110a, 110b. Moreover, an inner diameter of this through-hole will have a size corresponding to the outer diameter of the semiconductor film 120a, 120b. The semiconductor films 120a, 120b are formed in substantially a tapered shape, hence, as a result, the more upwardly positioned conductive film 110a, 110b of the conductive films 110a, 110b has the larger through-hole. This is due to shapes of the opening op1 formed in the step described with reference to FIG. 6 and the opening opt formed in the step described with reference to FIG. 9.

Now, an electric field applied to the semiconductor films 120a, 120b becomes stronger as the inner diameter of the through-hole provided in the conductive films 110a, 110b gets smaller. Particularly, in a vicinity of the lower end of the semiconductor film 120b, a voltage applied to the semiconductor film 120b sometimes ends up getting extremely large. Sometimes, in such a case, an electric field of an unintended strength ends up being applied to the gate electrode of the memory cell MC corresponding to the lower end vicinity of the semiconductor film 120b during the read operation and so on, a charge ends up being injected into the charge accumulating film of this memory cell MC, and the data held in the memory cell MC ends up changing.

Now, the semiconductor memory device according to the present embodiment includes the semiconductor film 120c connected to the upper end of the semiconductor film 120a and the lower end of the semiconductor film 120b. Moreover, the outer diameter of this semiconductor film 120c is smaller than the outer diameter of the upper end of the semiconductor film 120a, and larger than the outer diameter of the lower end of the semiconductor film 120b. This makes it possible to provide a semiconductor memory device in which the electric field applied to the gate electrode of the memory cell MC is relieved, thereby suppressing the above-mentioned kind of change in the data, and enabling control to be performed in a preferred manner.

Moreover, in order to achieve such a structure, in the present embodiment, after formation of the opening op2 (FIG. 9), the sacrifice film 151 is formed by a method such as an epitaxial crystal growth method (FIGS. 10 and 11), and the cover film 130B is formed on the inner circumferential surface of the opening opt and the upper surface of the sacrifice film 151 (FIG. 12). Moreover, whereas the block insulating films 133a, 133b are formed by oxidation treatment via the cover films 130A, 130B, the block insulating film 133c is formed by direct oxidation treatment of the sacrifice film 110A (FIG. 16). This makes it possible for the outer diameter of the block insulating film 133 formed in the lower end vicinity of the opening op2 to be made larger. As a result, the inner diameter of the through-hole of the conductive film 110 corresponding to this portion can be made larger, whereby application of an electric field of unintended strength of the kind mentioned above can be suppressed.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a substrate;
a plurality of first gate electrodes that are arranged in a first direction intersecting a surface of the substrate and extend in a second direction intersecting the first direction;
a first semiconductor film that extends in the first direction and faces the plurality of first gate electrodes, a width in the second direction of a one end on a substrate side of the first semiconductor film being smaller than a width in the second direction of the other end of the first semiconductor film;
a first gate insulating film that is provided between the plurality of first gate electrodes and the first semiconductor film;
a plurality of second gate electrodes that are arranged in the first direction, extend in the second direction, and are further from the substrate than the plurality of first gate electrodes;
a second semiconductor film that extends in the first direction and faces the plurality of second gate electrodes, a width in the second direction of a one end on a substrate side of the second semiconductor film being smaller than a width in the second direction of the other end of the second semiconductor film;
a second gate insulating film that is provided between the plurality of second gate electrodes and the second semiconductor film;
a third gate electrode that is provided between the plurality of first gate electrodes and the plurality of second gate electrodes, and extends in the second direction;
a third semiconductor film that is connected to the other end of the first semiconductor film and the one end of the second semiconductor film, a width in the first direction of the third semiconductor film being smaller than those of the first semiconductor film and the second semiconductor film, and a width in the second direction of the third semiconductor film being smaller than the width in the second direction of the other end of the first semiconductor film, and larger than the width in the second direction of the one end of the second semiconductor film; and
a third gate insulating film that is provided between the third gate electrode and the third semiconductor film.

2. The semiconductor memory device according to claim 1, wherein
the semiconductor memory device comprises a plurality of the third gate electrodes that are arranged in the first direction and are provided between the plurality of first gate electrodes and the plurality of second gate electrodes, and
the third semiconductor film faces the plurality of third gate electrodes.

3. The semiconductor memory device according to claim 1, wherein
the first gate insulating film comprises:
a first insulating film provided between the first gate electrode and the first semiconductor film;
a first charge accumulating film provided between the first gate electrode and the first insulating film; and
a second insulating film provided between the first gate electrode and the first charge accumulating film,
the second gate insulating film comprises:
a third insulating film provided between the second gate electrode and the second semiconductor film;
a second charge accumulating film provided between the second gate electrode and the third insulating film; and
a fourth insulating film provided between the second gate electrode and the second charge accumulating film, and
the third gate insulating film comprises:
a fifth insulating film provided between the third gate electrode and the third semiconductor film;
a third charge accumulating film provided between the third gate electrode and the fifth insulating film; and
a sixth insulating film provided between the third gate electrode and the third charge accumulating film.

4. The semiconductor memory device according to claim 3, further comprising:
a first interlayer insulating film provided between the plurality of first gate electrodes; and
a second interlayer insulating film provided between the plurality of second gate electrodes,
wherein
the second insulating film comprises:
a first portion provided between the first gate electrode and the first semiconductor film; and
a second portion provided between the first interlayer insulating film and the first semiconductor film,
the fourth insulating film comprises:
a third portion provided between the second gate electrode and the second semiconductor film; and
a fourth portion provided between the second interlayer insulating film and the second semiconductor film,
and wherein
a thickness in the second direction of the first portion is larger than a thickness in the second direction of the second portion, and
a thickness in the second direction of the third portion is larger than a thickness in the second direction of the fourth portion.

5. The semiconductor memory device according to claim 3, wherein
a width in the second direction of the sixth insulating film is larger than a width in the second direction of a one end on a substrate side of the fourth insulating film.

6. The semiconductor memory device according to claim 3, wherein
the fifth insulating film is connected to the first insulating film and the third insulating film,
the third charge accumulating film is connected to the first charge accumulating film and the second charge accumulating film, and
the sixth insulating film is connected to the second insulating film and is separated from the fourth insulating film.

7. The semiconductor memory device according to claim 6, wherein
a surface on a substrate side of the sixth insulating film is connected to an end section on an opposite side to the substrate of the first charge accumulating film, and
an end section on a substrate side of the fourth insulating film is connected to an end section on an opposite side to the substrate of the third charge accumulating film.

8. The semiconductor memory device according to claim 6, wherein
the semiconductor memory device comprises a plurality of the sixth insulating films arranged in the first direction, and
the sixth insulating film closest to the substrate, of the plurality of sixth insulating films is connected to the second insulating film.

* * * * *